(12) United States Patent
Asakawa

(10) Patent No.: US 6,953,952 B2
(45) Date of Patent: Oct. 11, 2005

(54) SEMICONDUCTOR DEVICE AND AN OPTICAL DEVICE USING THE SEMICONDUCTOR DEVICE

(75) Inventor: Hideo Asakawa, Anan (JP)

(73) Assignee: Nichia Corporation, Anan (JP)

( * ) Notice: Subject to any disclaimer, the term of this patent is extended or adjusted under 35 U.S.C. 154(b) by 17 days.

(21) Appl. No.: 10/655,323

(22) Filed: Sep. 5, 2003

(65) Prior Publication Data

US 2004/0046242 A1 Mar. 11, 2004

(30) Foreign Application Priority Data

Sep. 5, 2002 (JP) ........................................ 2002-259482
May 13, 2003 (JP) ........................................ 2003-133874

(51) Int. Cl.$^7$ ................................................ H01L 33/00
(52) U.S. Cl. ........................... 257/103; 257/98; 257/99; 257/100; 313/488; 313/489; 362/800
(58) Field of Search ................................ 362/241, 252, 362/260, 293, 294, 296, 327, 329, 339, 341, 373, 547, 800; 257/98–103, 676; 313/488–489, 498–504

(56) References Cited

U.S. PATENT DOCUMENTS 6,274,890 B1 * 8/2001 Oshio et al. ................... 257/98

6,747,293 B2 * 6/2004 Nitta et al. ................... 257/99
2001/0010449 A1 * 8/2001 Chiu et al. ................... 313/501

FOREIGN PATENT DOCUMENTS

JP          8-264842 A     10/1996
JP       2000-196153 A      7/2000

* cited by examiner

Primary Examiner—Minhloan Tran
Assistant Examiner—Thomas L Dickey
(74) Attorney, Agent, or Firm—Smith Patent Office

(57) ABSTRACT

A semiconductor device comprising a semiconductor element and a support member having a recess for housing the semiconductor element is disclosed. The support member includes lead electrodes and a support part holding the lead electrodes so that a surface of tip portions of the lead electrodes are exposed in a bottom of the recess. A main surface of the support member has at least a first main surface disposed adjacent to the recess and a second main surface disposed adjacent to the first main surface. The second main surface preferably has a protrusion and a further recess. The protrusion preferably forms an outer wall around a depression. The semiconductor device having this configuration has excellent and accurate positioning and can be strongly bonded with other members. The semiconductor device can also be obtained with a high process yield.

33 Claims, 26 Drawing Sheets

SEMICONDUCTOR DEVICE AND AN OPTICAL DEVICE USING THE SEMICONDUCTOR DEVICE

BACKGROUND OF THE INVENTION

1. Field of the Invention

The present invention relates to a light emitting device used in a back light of a liquid crystal display, a panel meter, an indicator light, a surface emitting optical switch, or the like. The present invention also relates to a light receiver device used in an optical receiver for an optical sensor, or the like, as well as the optical devices using the light emitting device or light receiving device.

2. Discussion of the Related Art

A semiconductor element can be used as a light emitting element or a light receiving element. Also, a semiconductor device can include a support part protecting the light emitting element and/or the light receiving element from the external environment, and lead electrodes connecting them.

When used as a light emitting device, a light emitting diode is capable of emitting mixed light in a white range with a high intensity by a combination of light from a light emitting element and a phosphor which absorbs the light and emits light in a different wavelength. A light source comprising light emitting diodes set in an array has been used in various areas. In such a light emitting diode, the light emitting elements can be fixed to a support member called a package so as to comprise the light emitting device. For example, a surface-mounted light emitting device has a light emitting surface of the light emitting device facing perpendicular to the mounting surface of the light emitting device. This device is capable of emitting light approximately parallel to the surface of the package as is disclosed in Japanese Unexamined Patent Publication No. 2000-196153.

Also, a light source is known where light from a light emitting diode is introduced to a translucent member through a light entrance face. The light emitting diode is fixed to the light entrance face. The light is then guided through the translucent member and is extracted from an output surface of the translucent member. These light sources include a planar light source such as a backlight for a liquid crystal display.

SUMMARY OF THE INVENTION

The outer shape of the package comprises thin film electrodes on an insulated base material. The insulated base material greatly contracts under high temperature and it has been hard to maintain uniform shapes for the base material. Furthermore, since this type of package uses thin film electrodes, the heat release rate goes down as the package is downsized. Consequently, the package includes a molded body formed by resin injection molding to try to make the light emitting device thinner and smaller, and to improve the rate of heat released from the device. Such a package is made by injection molding so that the lead electrodes can be inserted in the package.

After forming the package, portions of the lead electrodes which protrude from the side faces of the package are bent so as to facilitate the mounting of the package to the mounting base.

The lead electrodes where the semiconductor element is placed can be made with ease and can be made relatively large compared with the size of the package. This improves the heat transfer of the semiconductor element. However, when a package is formed by injection molding, a tolerance is created when bending (forming) and this results in difficulty in obtaining uniform shapes in quantity. Accordingly, when accuracy is required to mount a plurality of light emitting devices to an external support member or an optical member, it has been necessary to provide a different outer shape for each external support member or optical member, so as to fit to different shaped packages.

Consequently, the present invention has been devised to solve the above-mentioned problems. Therefore, an object of present invention is to provide a semiconductor device and an optical device using the semiconductor device having an excellent mounting efficiency using mass production.

A semiconductor device according to this invention has a semiconductor element and a support member having a recess for housing the semiconductor element. The main surfaces of tip portions of the lead electrodes are exposed in the bottom surface of the recess. The main surface of the support member has at least a first main surface and a second main surface which are respectively disposed away from the recess. According to such a configuration, the semiconductor device has a positioning shape on its main surface side, enabling the device to fit with other optical members or external support parts with high reliability and high precision positioning.

Also, the second main surface of the support member preferably has a recess and/or a protrusion. With this structure, an adhesive is used for mounting other members on the light emitting side. The adhesive can be applied to the second main surface to prevent the adhesive from flowing into the recess housing the semiconductor element. A firm attachment can be achieved with this structure without affecting the optical properties of the device.

The shapes of the recess and the protrusion on the second main surface are preferably formed by an external wall circling a depression. This wall prevents the adhesive from flowing out and allows the light emitting device to be made so as not to bond with other members or elements of the support member.

The first main surface is preferably shaped to have notch enabling more accurate placement of the device. Another member which has a shape that is capable of fitting into the notch allows this accurate relative placement.

The semiconductor element may be a light emitting element having a phosphor which includes Al and at least one element selected from Y, Lu, Sc, La, Gd, Tb, Eu, Ga, In, and Sm, and activated with at least one element selected from the rare earth elements. According to such a configuration, a mixed color light can be obtained by combining light emitted from the light emitting element and the wavelength converted light emitted from the phosphor.

Additionally, the semiconductor element may be a light emitting element comprising a phosphor which includes N, at least one element selected from Be, Mg, Ca, Sr, Ba, and Zn, and at least one element selected from C, Si, Ge, Sn, Ti, Zr, and Hf, and activated with at least one element selected from the rare earth elements. According to such a configuration, a mixed color light can be obtained by combining light emitted from the light emitting element and the wavelength converted light emitted from the phosphor. Also, the color rendering properties of the mixed color light can be improved.

In the present invention, the semiconductor element may be a light emitting element. The semiconductor device can be provided with a light emitting element comprising a semiconductor of a laminated structure. This structure has an active layer of a nitride semiconductor disposed between an N-type contact layer of a nitride semiconductor having an N-side electrode, and a P-type contact layer of the nitride semiconductor having a P-side electrode. The N-type contact layer comprises a first region having a semiconductor laminated structure with a P-side electrode, and a second region which is different from the first region, on the electrode forming side. The second region has a plurality of protrusions wherein the top portions of the protrusions are arranged closer to the P-type contact layer than the active layer, when viewed in a cross sectional view of the light emitting element.

A thinner light emitting device can be obtained by arranging the longitudinal direction of the light emitting element parallel to the longitudinal direction of the bottom face of the recess of the package. Furthermore, the light extraction efficiency can also be improved, and thus, a light emitting device with high reliability can be achieved. In addition, it is more preferable that the protrusion reduces in size from the N-type contact layer toward the P-type contact layer when viewed in the cross sectional view.

According to the present invention, the optical device includes the semiconductor device and a translucent member guiding light from the semiconductor device or guiding light to the semiconductor device. The translucent member comprises a light entrance portion fitting into the main surface of the semiconductor device.

With this configuration, a plurality of light emitting devices can be mounted to a translucent member with greater accuracy and in a manner that prevents light from leaking at the intersection of the light emitting device and the translucent member. Therefore, it is possible to mass produce a planar light source with excellent reliability and excellent optical properties.

BRIEF DESCRIPTION OF THE DRAWINGS

The above and other objects and features of the present invention will be clearly understood from the following description with respect to the preferred embodiments thereof when considered in conjunction with the accompanying drawings and diagrams, in which.

DETAILED DESCRIPTION OF THE PREFERRED EMBODIMENTS

After performing various tests, the inventor discovered a way for an improved mounting for a semiconductor device using an insert-type package. The package includes a portion having thermal distortion-resistant characteristics to enable the package to be positioned relative to other members. That is, in the present invention, the support part has at least a first main surface disposed adjacent to the recess for housing the semiconductor element and a second main surface disposed adjacent to and offset from the first surface. The presence of at least two main surfaces enables the positioning of the package with respect to the other members.

The present invention will be described with reference to the accompanying drawings in which preferred embodiments of the invention are shown by way of example, especially by using the example of a light emitting device. FIGS. 1–5 show schematic perspective views and schematic cross sectional views of light emitting devices according to the present invention. In addition, FIGS. 16A–16D show schematic cross sectional views of the molding process for the package of the present invention.

Figure 1A:
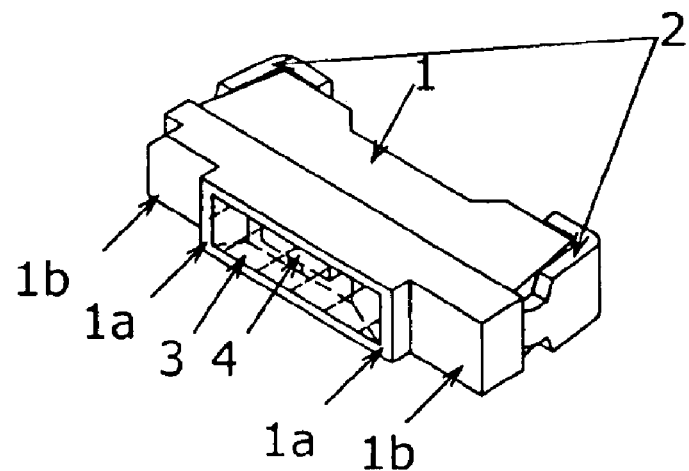
FIG. 1A is a schematic perspective view and FIG. 1B is a schematic cross sectional view of a light emitting device according to one embodiment of the present invention.

The light emitting device of the present invention has several embodiments. For example, as shown in FIG. 1A, a package 1 is formed by integral molding so that the end parts of both the positive and negative electrodes 2 can be inserted in the package 1. A recess is formed on a first main surface 1a of the package 1 for housing the light emitting element 4. The end portions of a positive electrode and a negative electrode are disposed on a bottom surface of the recess and are separated from each other while exposing their respective main surfaces. The gap between the positive and negative electrodes is filled with an insulating molding material.

Figure 6:
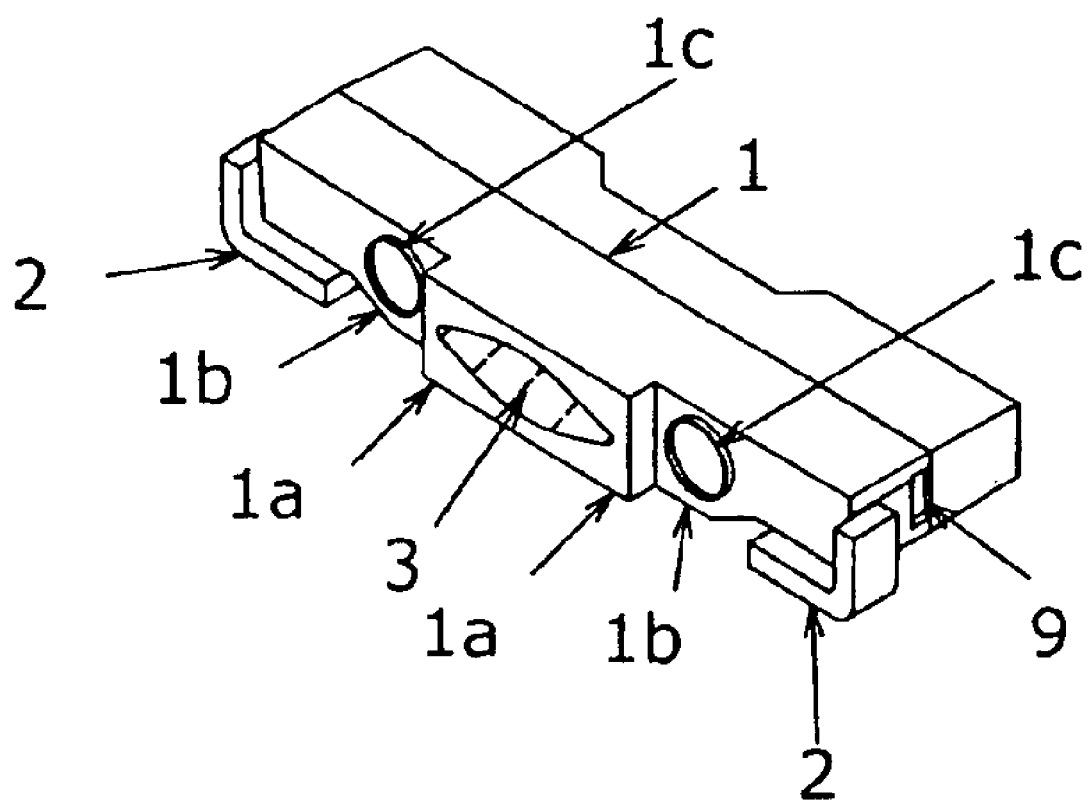
FIG. 6 is a schematic perspective view of the light emitting device according to a further embodiment of the present invention.

Here, the term "main surface" in the present specification refers to a surface of the light emitting device which is on the same side as the side which emits light from the light emitting element. Furthermore, the configuration of the light emitting surface formed on the main surface of the light emitting device is not limited to a rectangular shape as shown in FIG. 1A, but can be a elliptical shape as shown in FIG. 6. With such a configuration, the light emitting surface area can be maximized while the mechanical strength of the side wall which forms the recess can be retained. This structure also enables the light emitting device to emit light into a wider area.

The positive electrode and the negative electrode of a light emitting device of the present invention are inserted so that they protrude from the side ends of the package. The protruding parts of the lead electrodes are bent rearwardly away from the main surface of the package, or they are bent toward the mounting surface perpendicular to the main surface. Here, the mounting surface is the surface that is perpendicular to the main surface of the package and that is parallel to the longer side of the recess. In this arrangement, the light emitting device of the present invention is a side light emitting type which emits light approximately parallel to the mounting surface.

The package 1 used in the present invention comprises a recess formed in the main surface and defined by an interior wall 8 of the package. A step can be formed by a side wall in the main surface of the package disposed away from the recess. More specifically, the side wall can be disposed between at least a first main surface 1a which is adjacent to the recess and a second main surface 1b which is a step lower than or set back from the first main surface 1a. That is, a step is formed between the first main surface and the second main surface. This step is not necessarily provided perpendicularly to the longer sides of the first main surface. The step may be formed at an angle to the lengthwise direction of the semiconductor element as long as it facilitates fitting or matching of the semiconductor element device of the present invention relative to an external support part or an optical member. In addition, the shape of the step is not limited in shape to a single wall between the first main surface 1a and the second main surface 1b, as the step may also have more than two or three steps, which would then include a third main surface, a fourth main surface, etc. and several side walls between them. Because of this configuration, positioning of the device relative to other optical members, can be achieved uniformly by using at least the first main surface 1a and the second main surface 1b.

Attaching an optical member such as a lens having a specific shape to the device, or assembling a surface emitting light source by combining the light emitting device of present invention with an optical guide plate can be facilitated and enhances the light intensity and obtains the desired optical properties for the light emitting device in accordance with the present invention. At this time, by providing a shape on the optical member which is capable of fitting or matching with the shape of the main surface side having at least the first main surface 1a and the second main surface 1b of the light emitting device with no space between, a light source can be assembled with ease and precision. Therefore, a light source with excellent mass productivity and excellent optical properties can be obtained.

Figure 18A:
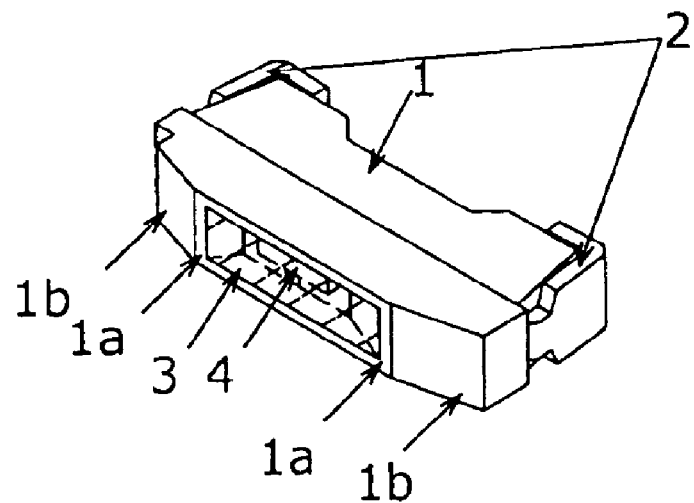
FIG. 18A is a schematic perspective view and FIG. 18B is a schematic cross sectional view of a light emitting device according to yet another embodiment of the present invention.
Figure 18B:
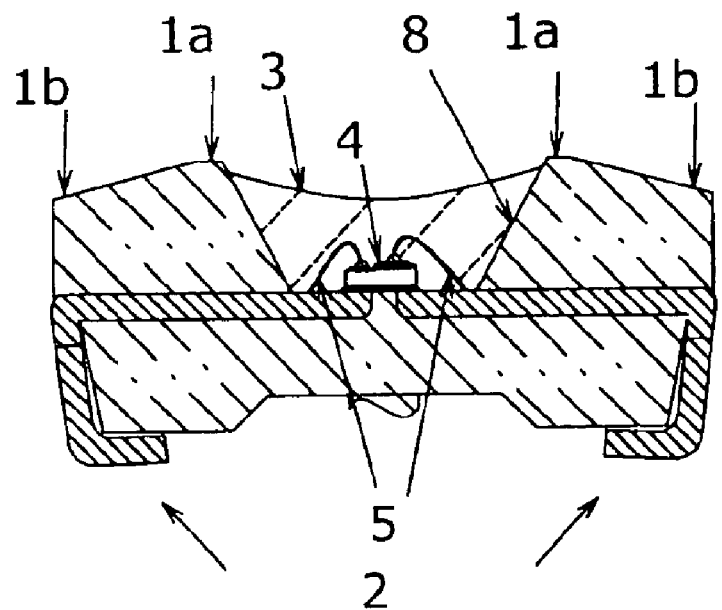
Figure 19A:
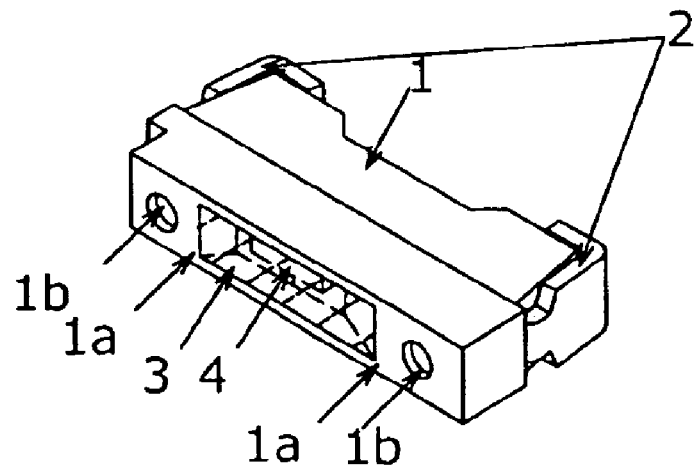
FIG. 19A is a schematic perspective view and FIG. 19B is a schematic cross sectional view of a light emitting device according to a further embodiment of the present invention.
Figure 19B:
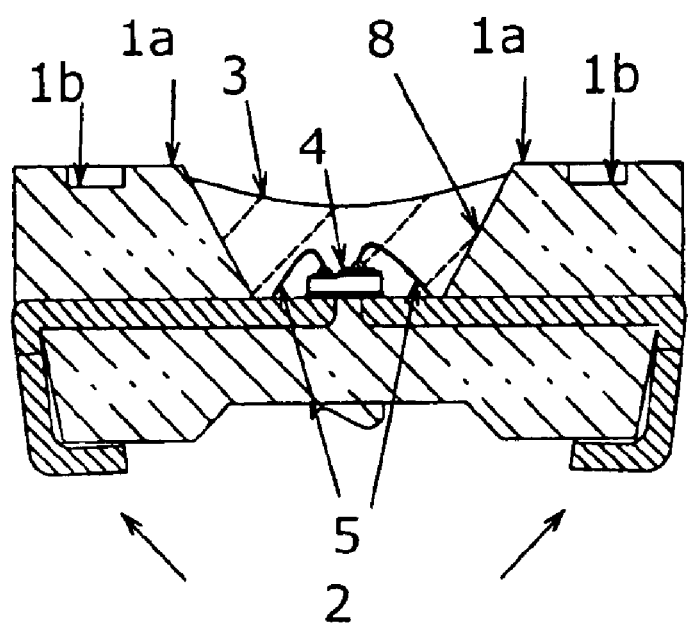
Figure 20A:
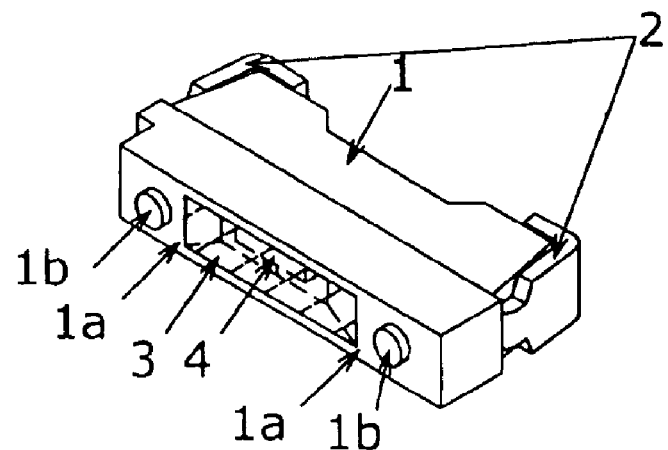
FIG. 20A is a schematic perspective view and FIG. 20B is a schematic cross sectional view of a light emitting device according to a still further embodiment of the present invention.
Figure 20B:
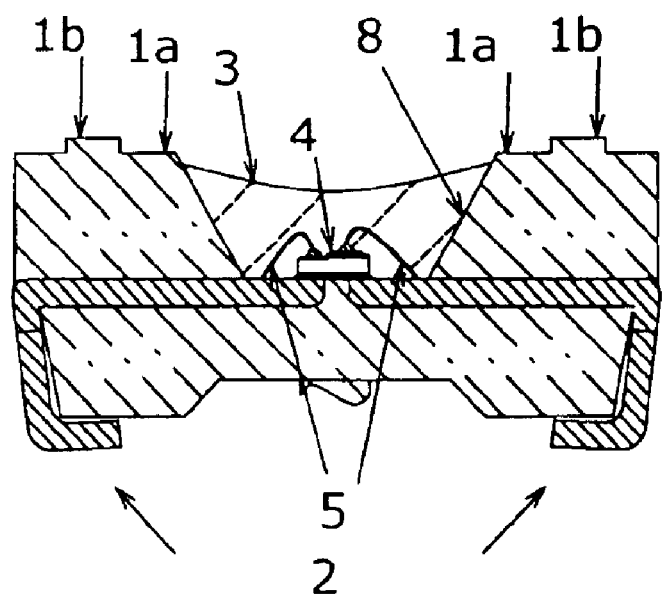

In addition, although the main surface has a step between the first main surface 1a and the second main surface 1b in the present embodiment, the present invention is not limited to a configuration having steps. It is also possible to have a main surface where the second main surface 1b is continuous with the first main surface 1a as shown in FIGS. 18A and 18B and described further below. By fabricating the mounting surface of the other optical members so as to fit the continuous first main surface 1a and second main surface 1b with no space therebetween, the present invention provides a light emitting device having an excellent capacity for installation with other optical members.

Figure 17A:
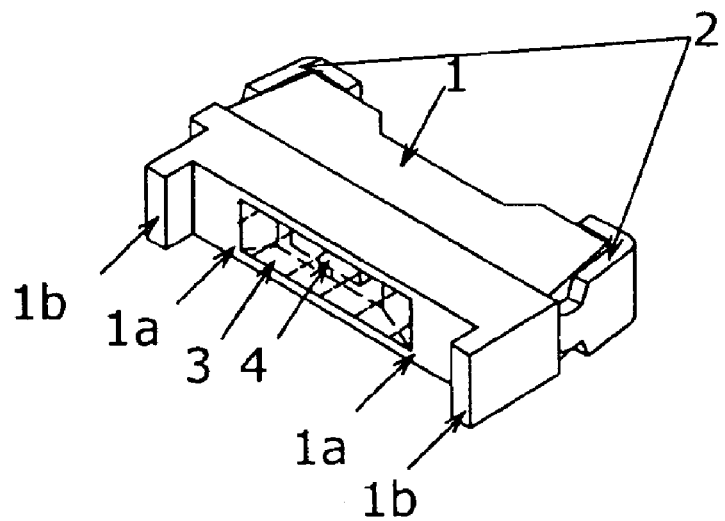
FIG. 17A is a schematic perspective view and FIG. 17B is a schematic cross sectional view of a light emitting device according to still another embodiment of the present invention.
Figure 17B:
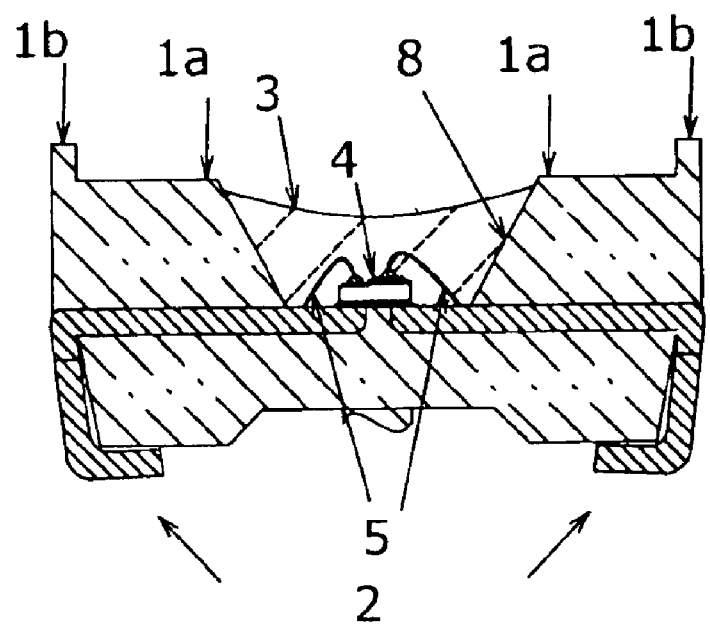

According to the embodiment shown in FIGS. 17A and 17B, the second main surfaces are defined by the protrusions 1b on both ends of the support member 1. The protrusions 1b do not necessarily need to be formed at the ends of the support member. They may be formed at any location suitable for positioning of the semiconductor device.

Figure 21A:
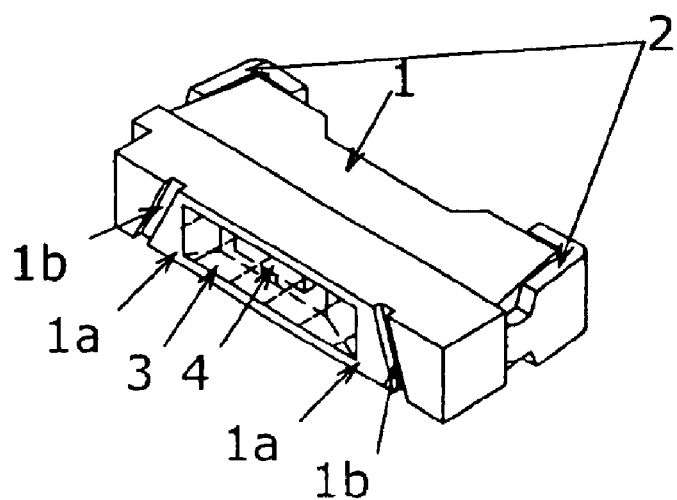
FIG. 21A is a schematic perspective view and FIG. 21B is a schematic cross sectional view of a light emitting device according to another embodiment of the present invention.
Figure 21B:
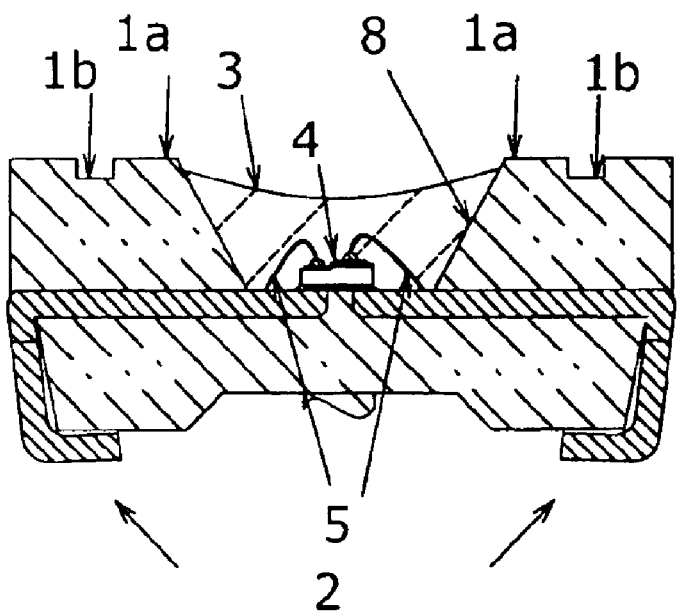

The protrusions 1b also do not necessarily need to perpendicularly extend to the longer side of the support member. They may also be formed as a groove extending diagonally with respect to the longer side, instead of a protrusion, as shown in FIGS. 21A and 21B.

Additionally, as shown in FIGS. 18A and 18B, the first main surface and the second main surface are continuous and angularly offset from each other. There is a dividing line between the first main surface and the second main surface on each side of the recess. The two dividing lines on the package that separate the second main surfaces from the first main surfaces do not necessarily need to be straight lines. These dividing lines (or surface interfaces) could also be curved. Similarly, the dividing surface separating the first main surface and the second main surface in the embodiments when they are offset, do not necessarily need to be planar. These surfaces can also be curved surfaces.

FIGS. 19A and 19B and FIGS. 20A and 20B show embodiments where the second main surface can be formed as a circular recess or a protrusion, respectively. The recess or protrusion does not necessarily need to be a circular. They also may other shapes including polygonal shapes.

Figure 22A:
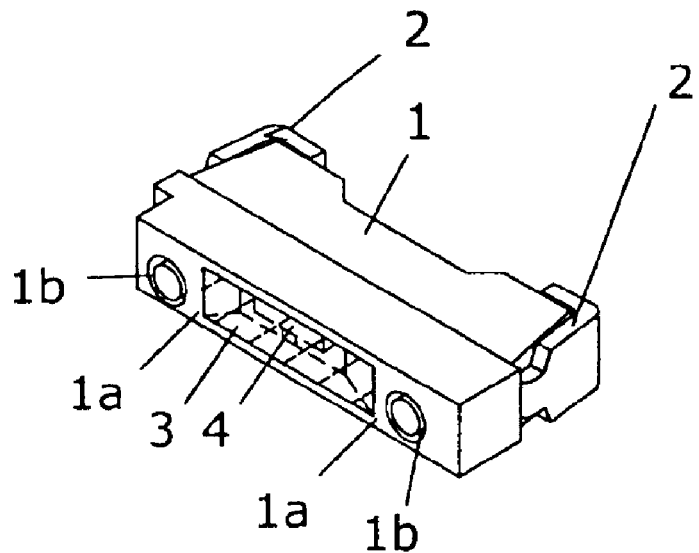
FIG. 22A is a schematic perspective view and FIG. 22B is a schematic cross sectional view of a light emitting device according to still another embodiment of the present invention.
Figure 22B:
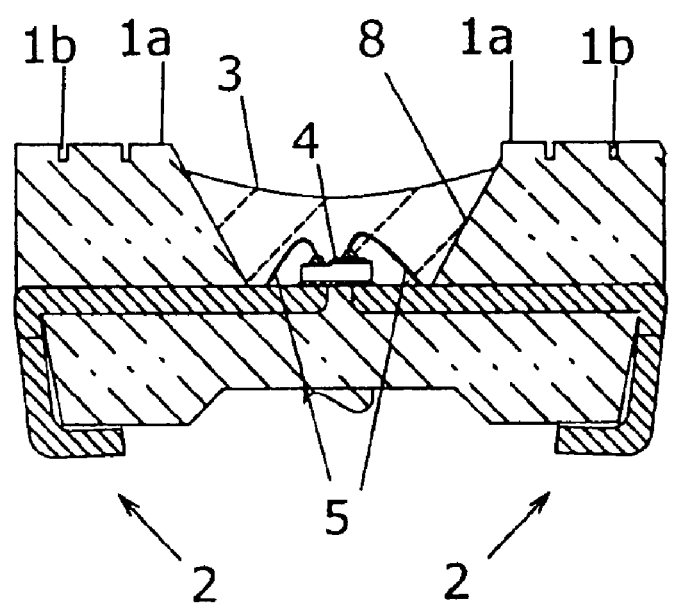
Figure 23A:
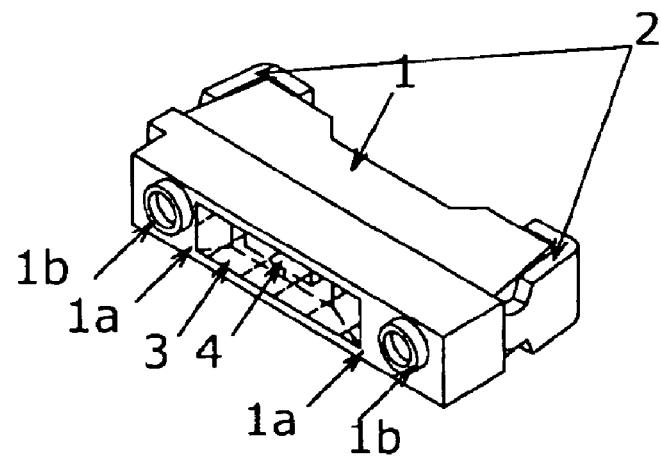
FIG. 23A is a schematic perspective view and FIG. 23B is a schematic cross sectional view of a light emitting device according to a further embodiment of the present invention.
Figure 23B:
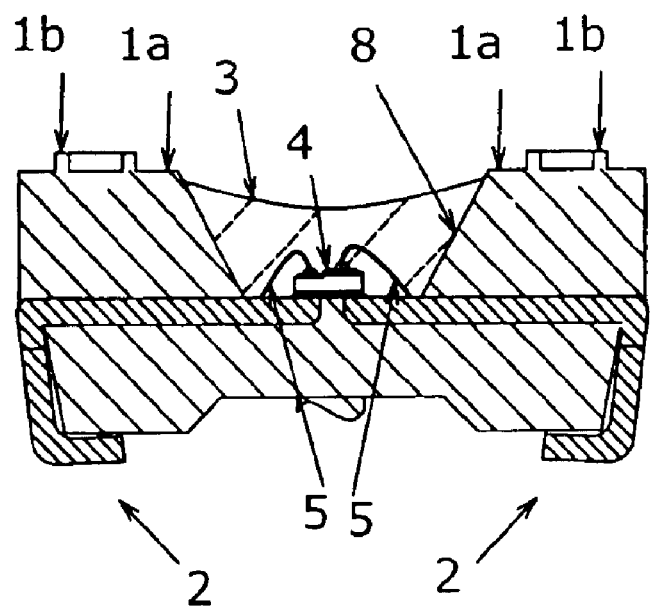

Furthermore the recess and the protrusion may be shaped as a circular groove as shown in FIGS. 22A and FIGS. 22B or as a raised circular wall as shown in FIGS. 23A and 23B. It is also possible to use differently shaped grooves, walls and/or recesses.

Figure 24A:
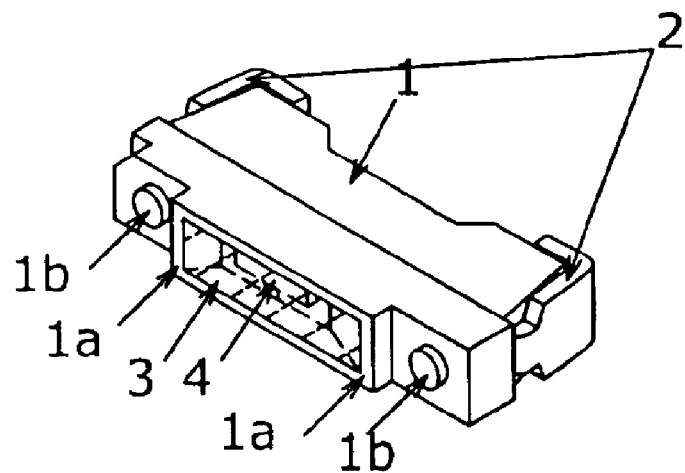
FIG. 24A is a schematic perspective view and FIG. 24B is a schematic cross sectional view of a light emitting device according to still another embodiment of the present invention.
Figure 24B:
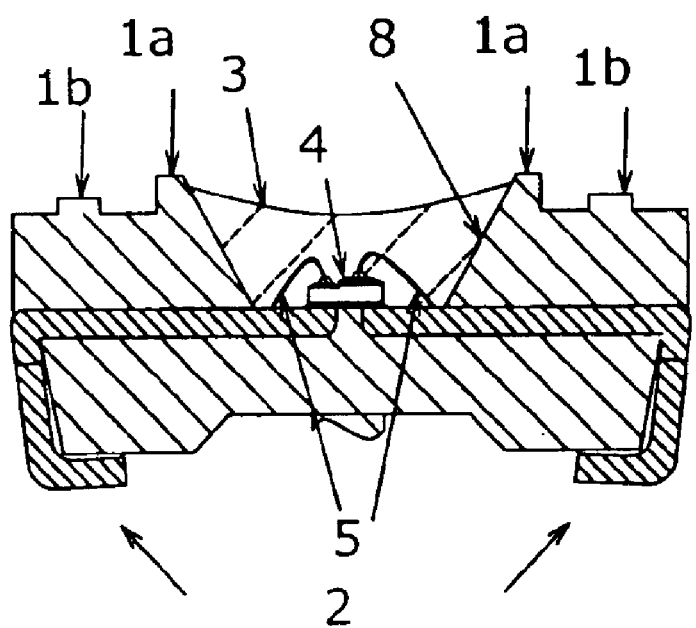

FIGS. 24A and 24B show an embodiment where the second main surface includes a protrusion such as a circular or elliptical protrusion.

Figure 25A:
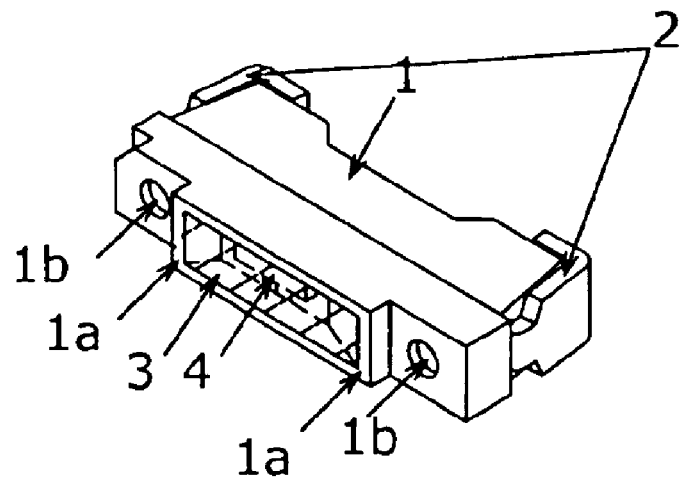
FIG. 25A is a schematic perspective view and FIG. 25B is a schematic cross sectional view of a light emitting device according to still another embodiment of the present invention.
Figure 25B:
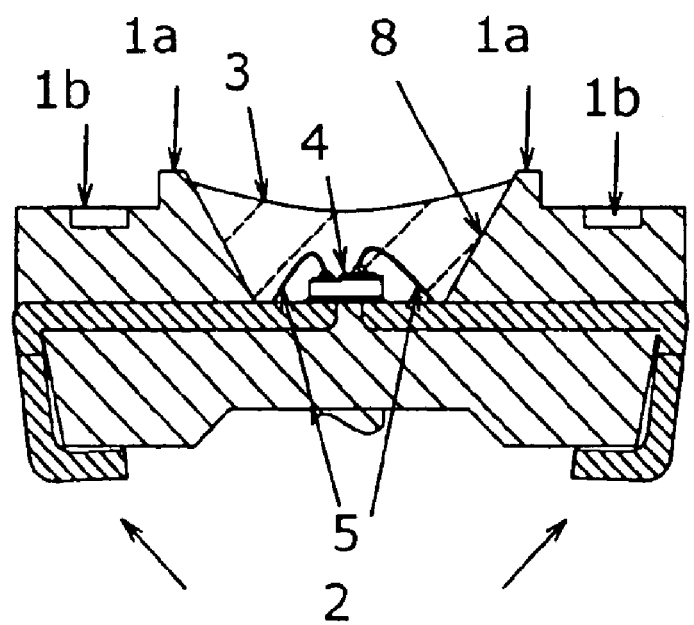

FIGS. 25A and 25B show an embodiment where the second main surface includes a recess such as a circular or elliptical recess.

Figure 26A:
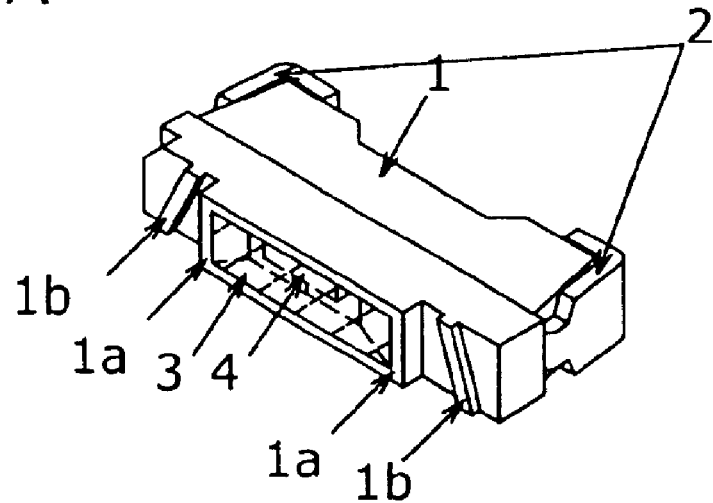
FIG. 26A is a schematic perspective view and FIG. 26B is a schematic cross sectional view of a light emitting device according to a further embodiment of the present invention.
Figure 26B:
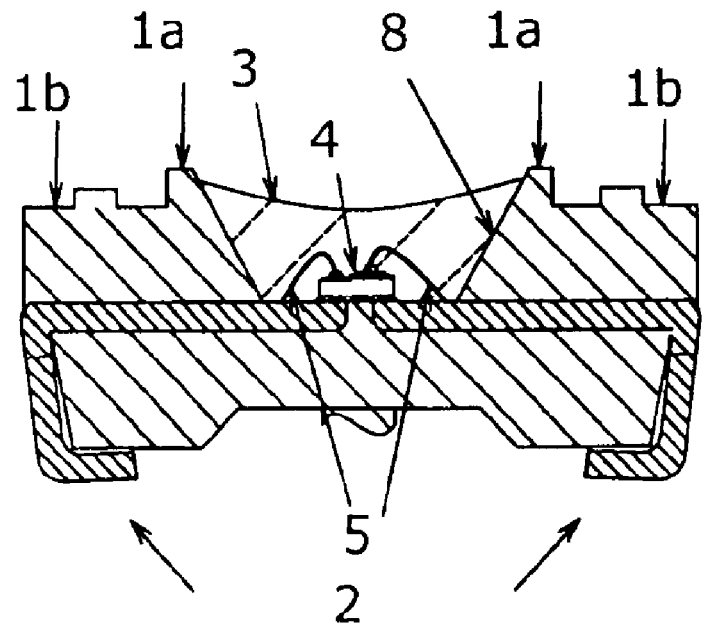

FIGS. 26A and 26B show an embodiment where the second main surface includes a protrusion which is formed so as to angularly extend between the opposed sides of the package.

As seen in the embodiments described above, the configuration defined by the first main surface and the second main surface of the present invention can be designed considering the position of the semiconductor, the viscosity of the adhesive as well as other factors.

FIGS. 16A through 16D show schematic cross sectional views showing the molding process of the package 1 according to one embodiment of the invention. The molding process of the package of the present invention is described in steps (a) through (d) below. (a) First, a lead frame 24 formed by punching a metal plate is sandwiched between the die 27 having a protrusion and the die 28 having a cavity. The lead frames 24 are placed in the resin-sealing space formed by the die 27 having a protrusion. The die 28 has a cavity so that the tip portions of the lead frames 24 are arranged so as to be opposite from each other and are spaced apart by a predetermined interval. (b) Next, as shown with the injection direction 29 of package molding member 26, the package molding member 26 is injected into the through-hole formed in the direction of the resin-sealing space, and the resin-sealing space is filled with the package molding member 26. (c) The package molding member 26 is then heated to cure the resin. (d) First, the die 28 having the cavity is removed and the pushing member 25 is shifted in a thrust direction 30 toward the second main surface 1b, which is a pin-knock face. Then the package 1 can be removed from the die 27 having a protrusion.

As described above, the package 1 formed by injection molding used in a light emitting device according to the present invention, is first formed in a mold. Then the package 1 is detached from the mold by pushing it out with a pushing member 25, such as a pin or the like, equipped in the mold.

However, when detaching the package, the molding member of the package still remains hot and is susceptible to deformation by external forces. For example, in the case wherein a main surface of the lead electrode 2 in the recess is used as a pin-knock surface, weak mechanical strength of the molding member may cause dislocation or deformation of the lead electrode 2. This can result in mounting the light emitting element 4 on a tilt, and thus the light emitting devices may not all be oriented for emitting light in the same direction. Therefore, it is necessary to arrange a pin-knock surface on the surface of the package 1.

In the case where the light emitting device is downsized, the end part of the package must be arranged as the pin-knock surface. However, it is possible that the package 1 may still be soft when detaching it from the molding die. If so, a part of the molding material may be pushed inwardly when knocked by the pin. In the case where the pin-knock surface is provided on the upper surface of the first main surface adjacent to the recess, the mold material that was pushed back may shift toward the light reflecting surface. This process causes deformation of the light reflecting surface and this may exert a damaging effect on the optical properties of the light emitting device.

In contrast, the light emitting device according to the present invention has the first main surface 1a and the second main surface 1b disposed in sequence outwardly from the recess which includes the light emitting surface. Therefore, the package can be detached from the die by arranging the second main surface as the pin-knock surface. This prevents deformation of the recess and enables mass production without causing a damaging effect to the light emitting properties.

The configuration of the second main surface 1b according to the present invention is not specifically limited. It is preferable to have a elevated portion 1c on the second main surface 1b, and it is also preferable to set the height of the elevated portion 1c to be lower than the height of the first main surface. According to this configuration, the contact area between the second main surface 1b and the adhesive member or the like, can be increased when fixing the light emitting device according to the present invention to other members, thereby enhancing their adhesion strength. Furthermore, as shown in FIGS. 2–4, it is preferable to form the external wall of the elevated portion 1c so that it is surrounding a depression. When the depression is filled with an adhesive member and it is fixed to an optical member or the like, the external wall prevents the adhesive member from flowing toward the lead electrode or the first main surface 1a. This forms a light emitting device with excellent reliability and excellent optical properties. In addition, the configuration having a protrusion 1c on the second main surface 1b can also be formed at the same time using process step (d) for removing the package 1, by pressing the pushing member 25 against the second main surface 1b.

The package 1 of an embodiment of the present invention has a recess capable of housing the light emitting element 4. The shape of the inner wall of the recess is not specifically limited. In the case where the light emitting element 4 is mounted, it is preferable to make the inner wall as a tapered wall, where its internal diameter widens toward the opening. This arrangement enables light emitted from the end face of the light emitting element 4 to pass through the light observation surface. In addition, a light reflection function can be added so as to enhance the light reflectivity, by providing a metal plating with Ag or the like on the inner surface of the recess.

In the light emitting device according to this embodiment of the present invention, the light emitting element 4 is placed in the recess of the package 1 formed as described above. Then a translucent resin is filled in the recess so as to cover the light emitting element 4 with a sealing portion 3.

In the following description, the production process and the individual components of the embodiments of the present invention will be described in more detail.

Process 1: Formation of the Lead Electrodes

In the present embodiment, the first process includes pulling a metal sheet to form a lead frame having plurality of pairs of positive and negative lead electrodes. Next, a plating operation is performed on the surface of the lead frame. In addition, a hanger lead which supports the packages throughout the production processes, from the step of lead electrode formation through the step of light emitting device partition, can be provided on a portion of the lead frame.

Lead Electrodes 2

The lead electrodes 2 in the present embodiment are electric conductors which supply power to the light emitting element and are capable of having the light emitting element mounted thereon. Particularly, the lead electrodes 2 are formed by integral molding so that one end of the lead electrode is inserted into the package and the other end protrudes from a surface of the package. In addition, the main surfaces of the end portions of the inserted electrodes 2 are exposed on the bottom surface of the recess in the package.

Although the materials for the lead electrodes 2 are not specifically limited except for related to conductivity, good adhesiveness with conductive wires 5 which form electrical connections with the semiconductor element and conductive bumps 6 as well as good electric conductivity are required. As an example of the value of the electrical resistance, 300 $\mu\Omega$-cm or less is preferable and 3 $\mu\Omega$-cm or less is more preferable. As for the material fulfilling such conditions, iron, copper, copper containing iron, copper containing tin, and aluminum, iron, or copper plated with gold or silver are preferably used.

In each portion of the pressed metal long sheet corresponding to a part of the package, an end face of the positive electrode is disposed so as to be separated from the negative electrode and opposite from an end face of the negative electrode. In the present embodiment, a specific process is not carried out on the lead electrode 2 where their surfaces of the end portions are exposed in the bottom face of the recess. However, the bond strength with the molding resin can be enhanced by providing at least a pair of through-holes on either side of the axis in the longitudinal direction of the recess.

Process 2: Formation of the Package

In the present embodiment, a package 1 is capable of mounting a light emitting element 4. The package 1 functions as a support member for securing the lead electrodes 2 where the light emitting element 4 is mounted. The package 1 also protects the light emitting element 4 and the conductive wires 5 from the external environment.

Next, the metal long sheet described above is placed between the mold 28 having a recess and the mold 27 having a protrusion and then the molds are closed. The molding member is injected into the cavity created by the closed molds, through a gate provided at the back face of the mold having a recess. The cavity described above corresponds to the outer shape of the package. In the present embodiment, the molds for shaping the molding resin portion are provided with steps on the main surface of the package. This structure obtains a package 1 having the first main surface 1a and the second main surface 1b which is placed a step lower than the first main surface 1a, and is also further from the recess than the first main surface 1a. In addition, it is preferable to insert the pressed metal long sheet between the mold 28 having a recess and the mold 27 having a protrusion in such way so that the direction of punching coincides with that of injection of resin into the molds. According to such placement of the metal long sheet, the resin can be filled in the space formed by the end portions of the positive and negative electrodes without leaving gaps. This arrangement also prevents molding resin from flowing out onto either of the main surfaces.

Figure 3A:
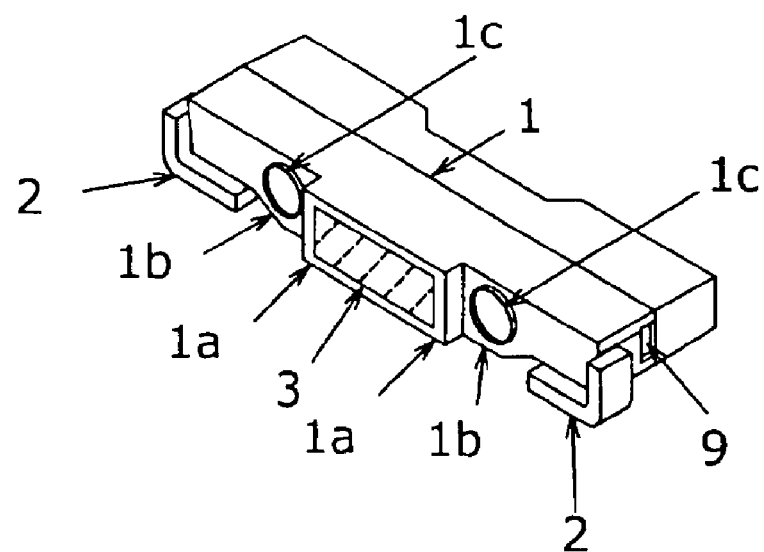
FIG. 3A is a schematic perspective view and FIG. 3B is a schematic cross sectional view of the light emitting device according to yet another embodiment of the present invention.
Figure 3B:
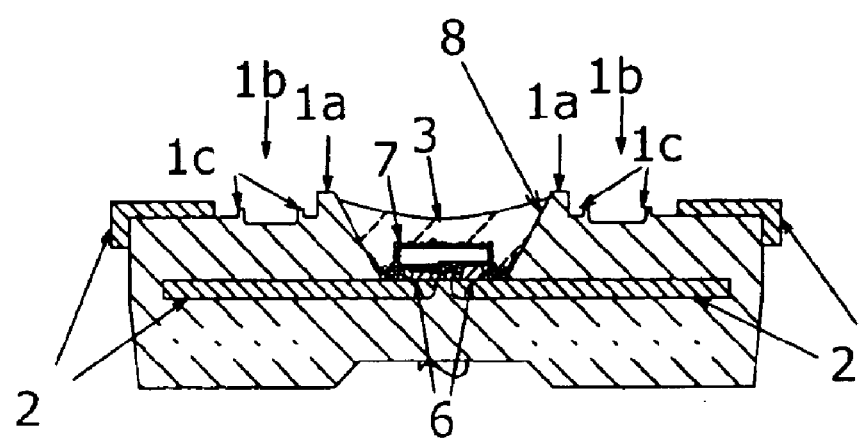

Furthermore, in the case where a hanger lead is provided on the lead frame, as shown in FIG. 3A, package 1 is formed having a recess on its side face corresponding to the shape of the end portion of the hanger lead. The hanger lead can also support the package throughout the production processes.

Molding Material

The molding material for the package used in the present invention is not specifically limited. A liquid crystal polymer, a polyphthalamide resin, a polybutylene terephthalate (PBT), or the like, as well as any other known thermoplastic resins can be used. When a semi-crystalline polymer resin containing crystals of high-melting point is used such as polyphthalamide resin, a package having a large surface energy and good adhesion with a sealing resin in the recess or with an optical guide plate, can be obtained. Accordingly, interfacial separation between the package recess and the sealing resin can be prevented when they are cooled. In addition, a white pigment substance such as titanium oxide or the like, can be mixed into the molding member of a package to enhance the efficiency of the reflection of light emitted from the light emitting chip.

The molding member formed in such a manner is detached from the mold as follows. First, the mold is opened, and the pin provided in the mold having a protrusion is thrust toward the second main surface of the package. At this moment, a cylindrical wall having an inner diameter which is the same as the size of a pinhead is formed. Such a cylindrical wall can prevent the flow of adhesive material while fixing the light emitting device to other members by using an adhesive material or the like, and can achieve an enhanced adhesive force.

Process 3: Mounting of the Semiconductor Element

Next, the semiconductor element is fixed to the lead electrode 2 exposed in the bottom face of the recess formed in the package 1. In the present embodiment, a semiconductor element will be illustrated as an example of a light emitting element. However, the semiconductor element used in the present invention is not limited to this light emitting element, and can be a photodetector, an electrostatic protection element (Zener diode), or an element which is made by a combination of at least two of these elements.

Light Emitting Element 4

As an example of the semiconductor element in the present invention, a semiconductor element may be used such as a light emitting element, a light receiving element, or the like. The semiconductor element in the present embodiment can also be an LED chip used as a light emitting element.

The light emitting element 4 is not specifically limited in the present invention. In the case where a fluorescent material is concurrently used, it is preferable to use a semiconductor light emitting element having an active layer capable of emitting light with a wavelength capable of exciting the fluorescent material. As an example of such a semiconductor light emitting element, various semiconductors such as ZnSe or GaN can be used. However, a nitride semiconductor ($In_xAl_yGa_{1-x-y}N$, $0 \leq X$, $0 \leq Y$, $X+Y \leq 1$) capable of emitting light with a short-wavelength that can sufficiently excite the fluorescent material is preferable. The nitride semiconductor may contain boron or phosphorus if needed.

As an example of the structure of the semiconductor, a homostructure, a heterostructure or a double heterostructure having an MIS junction, a PIN junction or a P-N junction can be used. A variety of emission light wavelengths can be selected depending on the materials or the degree of the mixed crystal in the semiconductor layers. In addition, the active layer can be of a single well structure or a multiple well structure, formed as a thin film wherein a quantum effect occurs.

In the case where a nitride semiconductor is used, a material such as sapphire, spinel, SiC, Si, ZnO, GaN, or the like, is preferably used as the semiconductor substrate. It is preferable to use a sapphire substrate in order to form a nitride semiconductor having good crystallinity and which can be efficiently produced in quantity. A nitride semiconductor can be formed on the sapphire substrate in accordance with MOCVD or the like. For example, a buffer layer, such as of GaN, AlN, GaAlN, or the like, can be formed on a sapphire substrate, and a nitride semiconductor having a P-N junction can be formed thereon. Furthermore, the substrate can be removed after formation of the semiconductor layers.

An example of a light emitting element having a P-N junction using a nitride semiconductor includes, for example, a double heterostructure wherein a first contact layer of N-type gallium nitride, a first cladding layer of N-type aluminum gallium nitride, an active layer of indium gallium nitride, a second cladding layer of P-type aluminum gallium nitride, and a second contact layer of P-type gallium nitride, are layered on the buffer layer in sequence. Nitride semiconductors show N-type conductivity when in the condition where no impurities have been doped. In order to form an N-type nitride semiconductor having the desired properties such as improved light emission efficiency, it is preferable to arbitrarily introduce an N-type dopant such as Si, Ge, Se, Te, C, or the like. On the other hand, in order to form a P-type nitride semiconductor, it is preferable to dope with a P-type dopant such as Zn, Mg, Be, Ca, Sr, Ba, or the like.

Due to the fact that a nitride semiconductor is not easily converted to the P-type solely by doping a P-type dopant, it is preferable to treat such a semiconductor after introduction of the dopant in processes such as heating in a furnace or irradiation with plasma. After forming the electrodes, the semiconductor wafer is cut into chips so that the light emitting elements of the nitride semiconductor can be obtained. In addition, an insulating protective film made of materials such as $SiO_2$ can be made by means of patterning and which covers the entire element except the bonding parts of each electrode which are exposed. Thus with this arrangement, downsized light emitting devices can be obtained with a high reliability.

In order to emit white light by using the light emitting diode of the present invention, it is preferable for the wavelength of light emitted from the light emitting element to be greater than or equal to 400 nm and less than or equal to 530 nm, and more preferably greater than or equal to 420 nm and less than or equal to 490 nm. These ranges take into consideration the complementary color relationship with fluorescent material and deterioration of the translucent resin, or the like. Furthermore, it is more preferable for the wavelength to be greater than or equal to 450 nm and less than or equal to 475 nm, in order to improve the excitation and the emission efficiency of the light emitting element and the fluorescent material. In addition, the light emitting elements having a main emission wavelength less than 400 nm, which is in ultraviolet region, or the short wavelength range of visible light can be used in combination with members relatively resistant to deterioration by ultraviolet light.

Bump 6

The light emitting element 4 in the present embodiment can obtain uniform emission when mounted by the flip tip method because there is no obstacle to shield emission at the light emitting face side. This method includes a pair of electrodes or bumps 6 provided on the same face side and placed to face a pair of lead electrodes exposed in the recess of the package. The material for the bumps 6 is not specifically limited except for its conductivity. It is preferable for the bumps 6 to contain at least one material which is included in the positive and negative electrodes of light emitting element or in the plating material of the positive and negative lead electrodes. In the present embodiment, a bump of Au is formed on each lead electrode 2, and each bump 6 and each lead electrode 2 are placed so as to be opposed to each other. Then these elements are bonded by ultrasonic soldering.

As an example of a different bump forming process, a stud bump can be obtained by cutting the wire so as to leave the edge portion of the wire after bonding an edge portion of the conductive wire. In another process, a bump can be obtained by metal deposition after forming the desired mask pattern, or the like. In addition, a bump can be provided first to the electrode side of the light emitting element, or it can be provided to both the lead electrode side and the light emitting element side, respectively.

Figure 7:
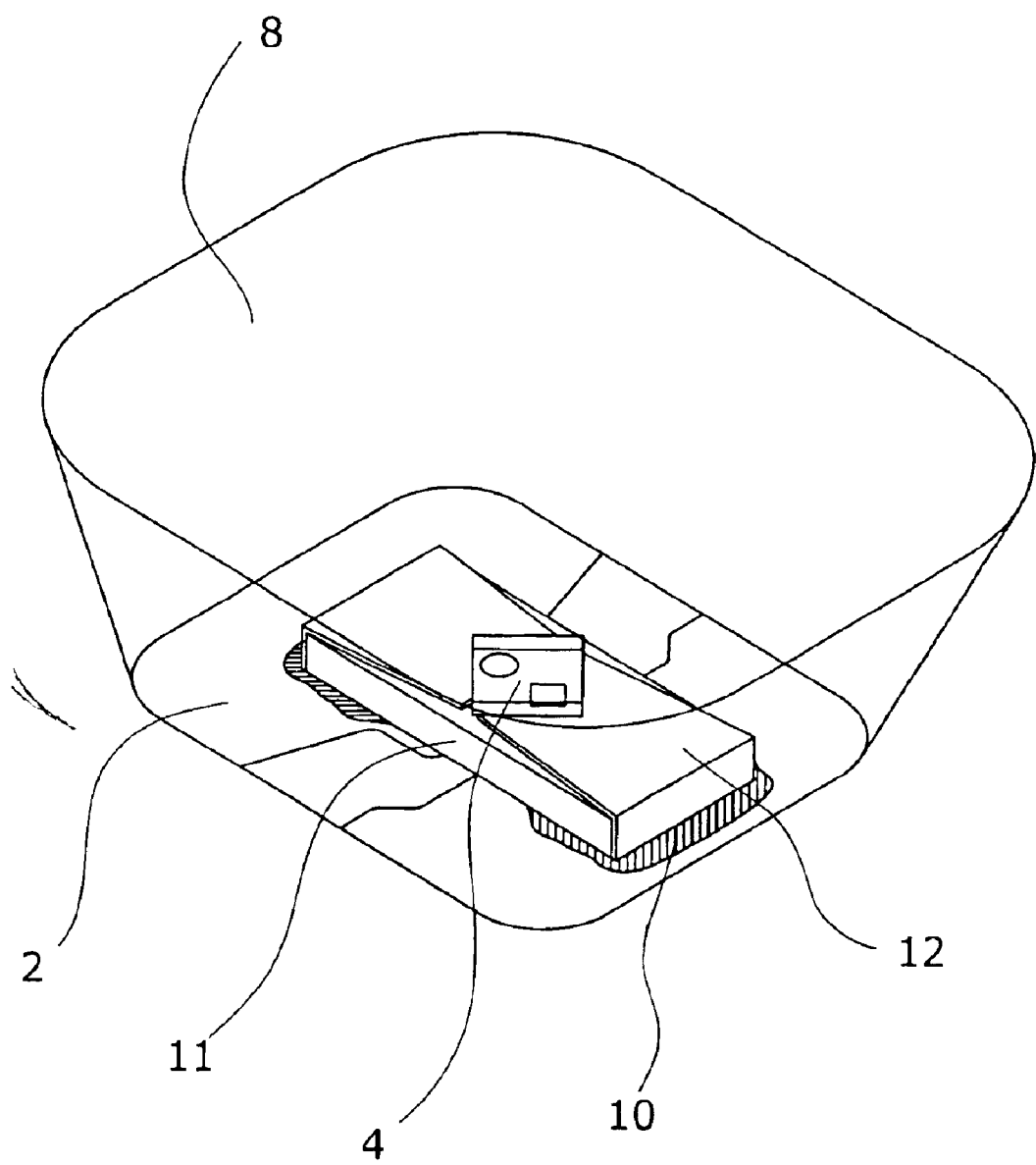
FIG. 7 is a schematic perspective view of the light emitting device according to still another embodiment of the present invention.

In addition, it is preferable to mount through a sub-mount when mounting by the flip tip method. FIG. 7 shows a schematic perspective view of mounting the light emitting diode 4 via a sub-mount according to an embodiment of the present invention. In the flip tip method, the interface between the light emitting element and the lead electrode 2 connected through the bump 6 is susceptible to separation caused by slippage of the lead electrode 2 due to thermal stress. In addition, it is difficult to narrow the space between opposed end portions of the positive and negative lead electrodes similar to the space between the positive and negative electrodes of the light emitting element. Therefore, it is difficult to achieve a stable connection of the light emitting element to lead electrode. By choosing the most suitable package materials, most of these problems can be solved to some degree, however, further improvement in the reliability of the light emitting device can be achieved with ease by using a flip tip mounting process via a sub-mount.

A conductive pattern provided by a conductive member 12 is placed on the surface of a sub-mount substrate 11 so as to extend from the side facing the light emitting element 4 to the side facing the lead electrode 2. The space between each of the conductive patterns can be as narrow as the space between the positive and the negative electrodes of the light emitting element 4 by using an etching method. The material for the sub-mount substrate 11 preferably has a thermal expansion coefficient approximately the same as that of the light emitting element 4, such as aluminum nitride in a nitride semiconductor element. The effect of thermal stress existing between the sub-mount 11 and the light emitting element 4 can be reduced by using such a material. Alternatively, silicon, which is capable of serving as an electrostatic protection element and is moderate in price, is preferred as the material for the sub-mount substrate 11. In addition, silver or gold having a high reflectivity is preferable for the conductive member 12. Further, it is preferable to provide holes in or concave or convex patterns on the surface of the sub-mount substrate except in the portion which would negatively affect mounting of the light emitting element 4. This configuration allows heat generated by the light emitting element 4 to be released effectively from the sub-mount. It is preferable to form more than one of the through-holes in the sub-mount substrate 11 in the direction of the thickness of the sub-mount substrate, and extend the above-described conductive member 12 to the inner wall of the through-hole, so that heat release can be increased further. In addition, the sub-mount in the present embodiment is directly connected to the conductive pattern and the lead electrode, and thus the conductive pattern may be connected to the lead electrode via a conductive wire.

In order to improve the reliability of the light emitting device, an underfill can be used between the positive and negative electrode of the light emitting element and the sub-mount. An underfill can also be used in the gap existing between the positive and negative electrodes of the light emitting element and the lead electrodes 2 exposed in the bottom of the recess of the package.

A thermosetting resin such as an epoxy resin may be used as a material for the underfill. In order to reduce thermal stress in the underfill, aluminum nitride, aluminum oxide, and their composite mixtures can be mixed into the epoxy resin. The amount of underfill required is an amount sufficient to fill the gap that occurs between the positive and negative electrodes of the light emitting element and the sub-mount.

The connection between the conductive pattern formed on the sub-mount and the electrode of the light emitting element 4 is made using an ultrasonic bonding method that includes a cementing material such as Au, an eutectic solder (Au—Sn, Pb—Sn), a lead-free solder or the like. Also, the connection between the conductive pattern formed on the sub-mount and the lead electrode can be made using a cementing material 10 such as a Au paste, a Ag paste or the like.

Conductive wires 5

After using die bonding to fix the light emitting element 4 onto one of the lead electrodes, each of the electrodes of the light emitting element can be connected by the conductive wires 5. Here, the cementing material used in die bonding is not specifically limited and insulating adhesives such as epoxy resin, Au—Sn alloy, resin or glass containing conductive material, or the like, can be used. It is preferable to use Ag as the conductive material. A light emitting device having excellent heat radiation and having a low stress after cementing can be obtained by employing Ag paste with 80% to 90% Ag content.

For the conductive wires 5, excellent properties for Ohmic contact, mechanical connectivity as well as electric and thermal conductivity are required. For thermal conductivity, 0.01 cal/(s)(cm2)(° C./cm) or greater is preferable, and 0.5 cal/(s)(cm2)(° C./cm) or greater is more preferable. In addition, it is preferable that the diameter of the conductive wires be greater than or equal to 10 $\mu$m and less than or equal to 45 $\mu$m in view of efficiency.

The conductive wire is susceptible to separation at the interface of the coating portion, which includes the fluorescent material, and the molding member, which does not include the fluorescent material. Even when the same material is used for both the coating portion and the molding portion, the fluorescent material is believed to be the cause of the separation due to a difference in thermal expansion. For this reason, the diameter of the conductive wire is preferably greater than or equal to 25 $\mu$m. For the reasons of enlarging the light emitting area and ease of handling, the diameter of the conductive wire is preferably less than or equal to 35 $\mu$m. The conductive wire can be a wire made of a metal such as gold, copper, platinum, aluminum, or the like, or an alloy using these metals.

Process 4: Sealing

Next, a sealing member 3 is provided to protect the light emitting element 4 from the external environment. The sealing step is carried out by filling the recess of the package 1 with the sealing member 3 so as to cover the light emitting element 4 and the conductive wires 5. Once the sealing member 3 fills the recess, the sealing member 3 begins to harden.

Sealing member 3

The properties material of the sealing member 3 are not specifically limited except for having translucency. A translucent resin having excellent properties for withstanding the weather, such as silicon resin, epoxy resin, urea resin, fluorocarbon resin, or a hybrid resin containing at least one of the resins, or the like, can be used as the sealing member 3. In addition, the sealing member 3 is not limited to an organic material. An inorganic material having excellent light resistance such as glass or silica gel can also be used. In addition, a sealing member can be made from many other materials, such as a thickening agent, a light diffusion agent, barium titanate, titanium oxide, aluminum oxide, silicon oxide, silicon dioxide, calcium bicarbonate, calcium carbonate, or a mixture including at least one of these materials.

Furthermore, the sealing member can obtain a lens property by making the emission face side of the sealing member into a desired form. The sealing member 3 functions to focus the light emitted by the light emitting chip. In addition, in the case where a semiconductor element is used as a light receiving element, the sensitivity of the light receiving device can be enhanced by arranging the sealing member so that light is guided and condensed in the direction of the light receiving element. For instance, the sealing member may be shaped as a convex lens or a concave lens. Further, the sealing member may also have an elliptic shape or some combination of these shapes.

Fluorescent material

In the present invention where a semiconductor element is used as the light emitting element, a variety of fluorescent materials made of inorganic materials or organic materials can be employed. These materials can be used in or around each of the components, such as the light emitting element, the sealing member, the die bonding member, the underfilling, or the package. For example, the fluorescent material can include a rare earth element which is an inorganic fluorescent material.

For the fluorescent material having a rare earth element, a garnet type fluorescent material including at least one element selected from the group comprising Y, Lu, Sc, La, Gd, Tb and Sm, and at least one element selected from the group comprising Al, Ga and In can be used. Specifically, the aluminum-garnet phosphor used in the present embodiment can be a phosphor that contains Al and at least one element selected from Y, Lu, Sc, La, Gd, Tb, Eu, Ga, In, and Sm, and that is activated with at least one element selected from the rare earth elements. The phosphor is excited by the visible light or ultraviolet rays emitted from the light emitting element and therefore the phosphor emits light. For example, in addition to the yttrium-aluminum oxide phosphor (YAG phosphor) described below, $Tb_{2.95}Ce_{0.05}Al_5O_{12}$, $Y_{2.90}Ce_{0.05}Tb_{0.05}Al_5O_{12}$, $Y_{2.94}Ce_{0.05}Pr_{0.01}Al_5O_{12}$, $Y_{2.90}Ce_{0.05}Pr_{0.05}Al_5O_{12}$, or the like, can be used. Among them, more than two kinds of yttrium-aluminum phosphors of different compositions, each containing Y and activated with Ce or Pr can be used.

In addition, the nitride phosphor used in the present invention is a phosphor that contains N, at least one element selected from Be, Mg, Ca, Sr, Ba and Zn, and at least one element selected from C, Si, Ge, Sn, Ti, Zr and Hf, and activated with at least one element selected from the rare earth elements. Furthermore, the nitride phosphor used in the present embodiment is a phosphor that absorbs visible light or ultraviolet rays emitted from the light emitting element or YAG phosphor and this causes a light emission from the phosphor. Examples of nitride phosphors, include $(Sr_{0.97}Eu_{0.03})_2Si_5N_8$, $(Ca_{0.985}Eu_{0.015})_2Si_5N_8$, $(Sr_{0.679}Ca_{0.291}Eu_{0.03})_2Si_5N_8$, or the like.

Each of the phosphors will be described in detail below.

Yttrium-aluminum Oxide Phosphor

The fluorescent material used for the light emitting device in the present embodiment uses a yttrium aluminum oxide phosphor activated with cerium which is excited by the light emitted from the semiconductor light emitting element having an active layer, and which is capable of emitting light in different wavelengths. Specifically, $YAlO_3$:Ce, $Y_3A_{15}O_{12}$:Ce(YAG:Ce) or $Y_4A_{12}O_9$:Ce, as well as a mixture of these compounds can be used as yttrium aluminum oxide phosphors. At least one element of Ba, Sr, Mg, Ca and Zn can be contained in the yttrium aluminum oxide phosphor. In addition, the particle size of the fluorescent material can be controlled by adding Si in order to restrain the crystal growth reaction. In the present specification, the yttrium aluminum oxide phosphor activated by Ce should be broadly interpreted as including fluorescent materials having a fluorescent property with part or all of the yttrium substituted with one of the elements selected from the group comprising Lu, Sc, La, Gs and Sm, or with a portion or all of aluminum substituted with one or two elements of Ba, Tl, Ga and In.

In further detail, the fluorescent material is a photoluminescence fluorescent material represented by the general formula $(Y_zGd_{1-z})_3Al_5O_{12}$:Ce (wherein $0<z\leq 1$), or a photoluminescence fluorescent material represented by the general formula $(Re_{1-a}Sm_a)_3Re'_5O_{12}$:Ce (wherein $0\leq a<1$, $0\leq b\leq 1$, Re is at least one element selected from Y, Gd, La and Sc, and Re' is at least one element selected from Al, Ga, and In). The above described fluorescent material has a garnet structure, and therefore it has properties resistant to heat, light and moisture, and is capable of being adjusted so that its peak wavelength of its excitation spectrum is about 450 nm. In addition, the fluorescent material emits light having a peak emission wavelength of about 580 nm and a broad emission spectrum which gradually diminishes toward the 700 nm range.

The excitation luminous efficiency in the long-wavelength range of 460 nm and above can be improved by including Gd in the crystal of the photoluminescence fluorescent material. By increasing in the content of Gd, the peak emission wavelength shifts toward a longer wavelength, and the wavelength of the entire emission spectrum also shifts toward longer wavelengths. That is, when emission of a more reddish light is required, it can be obtained by increasing the degree of substitution of Gd. On the other hand, when the Gd content is increased, the light of photoluminescence in terms of blue light tends to decrease. Tb, Cu, Ag, Au, Fe, Cr, Nd, Dy, Co, Ni, Ti, Eu, Pr, or the like can be included in addition to Ce if desired.

In addition, by substituting a part of Al with Ga in the composition of yttrium aluminum garnet fluorescent material, the emission wavelength can be shifted toward a shorter wavelength. On the other hand, by substituting a part of Y with Gd, the emission wavelength can be shifted toward a longer wavelength. When substituting a part of Y with Gd, it is preferable to limit the substituted Gd to less than 10%, while adjusting the degree of substitution of Ce from 0.03 to 1.0 in the molar ratio. When substituted Gd content is less than 20%, the green component in the emission is greater and that of the red component is less. However, by increasing the content of Ce, the red component in the emission can be compensated, and a desired color tone can be obtained without decreasing the luminance. According to such a configuration, desirable temperature characteristics of the fluorescent material can be obtained, thereby improving the reliability of the light emitting diode. Also, when the photoluminescence fluorescent material that is adjusted to include a more reddish component is used, a compound color such as pink can be emitted, thereby enabling the light emitting device to be formed with excellent color rendering properties.

The raw material for making such a photoluminescence fluorescent material is made in such a way that sufficiently mixes oxides of Y, Ga, Gd, Al, and Ce or compounds which can be easily converted into these oxides at high temperature as raw materials for Y, Ga, Gd, Al, and Ce in accordance with the stoichiometric ratio. The mixture material may also be made by dissolving rare earth elements Y, Gd, and Ce in stoichiometric proportions in an acid, coprecipitating the solution with oxalic acid and firing the coprecipitation to obtain an oxide of the coprecipitate, and then mixing it with aluminum oxide.

The obtained raw material is mixed with an appropriate amount of fluoride, such as barium fluoride or ammonium fluoride used as a flux, and is charged into a crucible and fired at 1350–1450° C. in air for 2 to 5 hours to obtain the calcinated material. The calcinated material is then ball-milled in water, washed, separated, dried, and finally, sieved thereby obtaining the desired material.

Also, the firing above is preferably carried out in two steps. The first step includes firing the mixture of raw materials for the fluorescent material and the flux in air or in a slightly reduced atmosphere. The second step includes firing them in a reduced atmosphere. The slightly reduced atmosphere means an atmosphere containing at least the necessary amount of oxygen for the reaction process to form a desired fluorescent material from the mixed raw materials. By carrying out the first firing step in the slightly reduced atmosphere until the formation of the desired structure for the fluorescent material has completed, darkening of the fluorescent material and deterioration in its light absorbing efficiency can be prevented.

Also, the reduced atmosphere in the second firing step means an reduced atmosphere stronger in the degree of reduction than the above discussed slightly reduced atmosphere. Therefore, a light emitting device employing a fluorescent material produced as described above can achieve a reduction in the quantity of phosphor necessary to obtain light with a desired color tone. It is also possible to obtain a light emitting device having an excellent light extraction efficiency.

Silicon Nitride Fluorescent Material

Also, a fluorescent material which is excited by absorbing light such as visible light emitted from the light emitting element, ultraviolet or light emitted from other fluorescent materials to thereby emit light, can be used. Specifically, a silicon nitride fluorescent material in which Mn is added, such as Sr—Ca—Si—N:Eu, Ca—Si—N:Eu, Sr—Si—N:Eu, Sr—Ca—Si—O—N:Eu, Ca—SiO—N:Eu, and Sr—Si—O—N:Eu, as component elements can be used. The fluorescent materials described above are represented by general formulas $L_XSi_YN_{(2X/3+4Y/3)}$:Eu or $L_XSi_YO_Z N_{(2X/3+4Y/3-2Z/3)}$:Eu (wherein L is one of Sr, Ca, Sr, or Ca). In the general formula, X=2, Y=5, or X=1, Y=7 is preferable, although arbitrary numbers can also be applied.

More specifically, it is preferable to use a fluorescent material in which Mn is added and represented by the general formulas $(Sr_XCa_{1-X})_2Si_5N_6$:Eu, $Sr_2Si_5N_8$:Eu, $Ca_2Si_5N_8$:Eu, $Sr_XCa_{1-X}Si_7N_{10}$:Eu, $SrSi_7N_{10}$:Eu, or $CaSi_7N_{10}$:Eu. However, the fluorescent material can also include at least one element selected from the group consisting of Mg, Sr, Ca, Ba, Zn, B, Al, Cu, Mn, Cr, and Ni. The proportion of Sr and Ca can also be changed when desired. Further, a fluorescent material having excellent crystallinity can be provided at a low price by including Si in the formula.

When $Eu^{2+}$ is used as an activator for the host crystal of silicon nitride with alkaline-earth metals, it is preferable to use a material wherein O is removed from $Eu_2O_3$, such as elemental Eu or europium nitride. However, this is not limited to the case where Mn is added. Adding Mn accelerates the diffusion of Eu2+, and thereby improves the luminous efficiency such as luminance, energy efficiency and quantum efficiency. Mn is included in a raw material, or it is included during the production process as an element or a compound. Then it is fired with the raw materials. However, after firing, Mn is not included among the basic component elements, or remains small in proportion to its initial content. This is considered to be due to the scatter of Mn in the firing process.

Also, by including at least one element selected from the group consisting of Mg, Sr, Ca, Ba, Zn, B, Al, Cu, Mn, Cr, O, and Ni, a fluorescent material can easily be obtained in a large particle size with an improved luminance. Also, B, Al, Mg, Cr, and Ni have properties that can restrain afterglow.

The nitride fluorescent material described above absorbs a portion of blue light and emits light from the yellow region to the red region. A combination of such a nitride fluorescent material with a fluorescent material which emits yellow light such as a YAG fluorescent material, and a light emitting element which emits blue light, enables a light emitting device to emit white light with a warm tone by mixing light in the yellow to red light region with the blue light. The light emitting device emitting mixed light in the white region can increase the special color rendering index R9 close to 40 at the color temperature of about Tcp=4600 K.

Next, the production method of the fluorescent material according to the present invention $((Sr_xCa_{1-x})_2Si_5N_6:Eu)$ will be described. The production method is not limited to the method that is described. The fluorescent material described above includes Mn and O.

The raw materials of Sr and Ca are ground. It is preferable to use elemental Sr and Ca for the raw materials, however, a compound such as an imide or an amide can be used. Also, B, Al, Cu, Mn, $Al_2O_3$, or the like, can be included in the raw materials of Sr and Ca. The raw materials of Sr and Ca are ground in a glove box in an argon atmosphere. The average particle diameter is preferably from about 0.1 µm to 15 µm, however, it is not limited to this range. The purity of Sr and Ca is preferably 2N and above, however, it is not limited to this grade. In order to improve the mixed state, a raw material can be used which is prepared by making an alloy of at least one of metallic Ca, metallic Sr, and metallic Eu, and then forming a nitride compound and grinding the formed nitride compound.

The Si raw material is ground. It is preferable to use elemental Si, however, a nitride, an imide, an amide, or the like, can also be used. For example, $Si_3N_4$, $Si(NH_2)_2$, $Mg_2Si$ or the like, can be used. The purity of Si is preferably 3N and above, however, a compound such as $Al_2O_3$, Mg, metallic borate ($Co_3B$, $Ni_3B$, CrB), manganese oxide, $H_3BO_3$, $B_2O_3$, $Cu_2O$, CuO, or the like, can also be included. Si is also ground in an argon or nitrogen atmosphere, in a glove box. This is the same procedure for the raw materials of Sr and Ca. The average particle diameter of the Si compound is preferably from about 0.1 µm to 15 µm.

Next, nitride compounds of Sr and Ca can be formed in a nitrogen atmosphere. The reaction formulas are shown by the following formulas, respectively.

$$3Sr+N_2 \rightarrow Sr_3N_2 \qquad \text{(formula 1)}$$

$$3Ca+N_2 \rightarrow Ca_3N_2 \qquad \text{(formula 2)}$$

Forming a nitride of Sr and Ca is carried out in a nitrogen atmosphere at from 600° C. to 900° C. for about 5 hours. Nitrides of Sr and Ca can be formed either as a mixture or individually. The nitrides of Sr and Ca are preferably of a high purity, however, a commercially available material can also be used.

Next, forming a nitride of Si raw material is carried out in a nitrogen atmosphere. The reaction formula is shown below in formula 3.

$$3Si+N_2 \rightarrow Si_3N_4 \qquad \text{(formula 3)}$$

A nitride of Si can be made in a nitrogen atmosphere at 800° C. to 1200° C. for about 5 hours. The silicon nitride used in the present invention is preferably of a high purity, however, a commercially available material can also be used.

Grinding is carried out on the nitride of Sr, Ca, or Sr—Ca. Sr, Ca, or a nitride of Sr—Ca is ground in an argon or nitrogen atmosphere in a glove box.

Similarly, grinding is carried out for the nitride of Si. Also, an Eu compound, $Eu_2O_3$ is ground as well. As for an Eu compound, europium oxide is used, however, metallic europium, nitride europium, or the like, can also be used. It is preferable to use europium oxide having a high purity, however, a commercially available grade can also be used. After grinding, the average diameter of the nitride of the alkaline-earth metal, silicon nitride and europium oxide is preferably from about 0.1 µm to 15 µm.

The raw materials described above can include at least one element selected from the group consisting of Mg, Sr, Ca, Ba, Zn, B, Al, Cu, Mn, Cr, O, and Ni. Also, the above elements, such as Mg, Zn, and B, may be mixed in the mixing process described below, in a predetermined compounding ratio. The elements described above can also be added to the raw materials individually, however, they are usually added as a compound. Compounds of this kind include $H_3BO_3$, $Cu_2O_3$, $MgCl_2$, MgO.CaO, $Al_2O_3$, metallic boride (CrB, $Mg_3B_2$, $AlB_2$, MnB), $B_2O_3$, $Cu_2O$, CuO, or the like.

After grinding, Sr, Ca, a nitride of Sr—Ca, silicon nitride, $Eu_2O_3$ as a compound of Eu are mixed, and Mn is added. Because the mixture of these materials is susceptible to oxidation, the mixing process is carried out an argon or nitrogen atmosphere, in a glove box.

Finally, the mixture of Sr, Ca, a nitride of Sr—Ca, silicon nitride, $Eu_2O_3$ as a compound of Eu is fired in a nitrogen atmosphere. By firing with additional Mn, a fluorescent material represented by the general formula $(Sr_xCa_{1-x})_2Si_5N_8$:Eu can be obtained. The composition of the objective fluorescent material can be changed by changing the compounding ratio (mixing ratio) of each rare earth material.

A tubular furnace, a compact furnace, a high-frequency furnace, a metal furnace, or the like, can be used for firing. The firing can be carried out in the temperature range of from 1200° C. to 1700° C, however, the range from 1400° C. to 1700° C. is more preferable.

As for firing, a one step firing method in which the furnace temperature is gradually increased, and the firing is carried out at 1200° C. to 1500° C. for several hours, is preferable. However, a two step firing method (the multistage firing) wherein the first firing step is carried out at 800° C. to 1000° C., and the furnace temperature is gradually increased, and the second firing step is carried out at 1200° C. to 1500° C., can also be employed. The raw material of the fluorescent material is preferably fired using a crucible or a boat made of boron nitride (BN). Other than a crucible of boron nitride material, an alumina ($Al_2O_3$) crucible can also be used.

Using the above production process, the desired fluorescent material can be obtained.

In addition, the fluorescent material that is capable of emitting a reddish light and that is usable in the present embodiment is not particularly limited and can include, for example, $Y_2O_2S:Eu$, $La_2O_2S:Eu$, $CaS:Eu$, $SrS:Eu$, $ZnS:Mn$, $ZnCdS:Ag$, Al, $ZnCdS:Cu,Al$, or the like.

The phosphors capable of emitting a reddish light are typified by aluminum garnet phosphors and nitride phosphors, produced as described above. These phosphors can be included in the single phosphor layer where more than two kinds of phosphors are included, or they can be included in the two layers of phosphor where each layer includes one or more than one kind of phosphor, formed around the light emitting element. The phosphor layer is formed by means of potting or stencil plate printing using an inorganic translucent member, such as a translucent resin or glass as adhesives.

Also, it is possible to use a method where the phosphor layer is formed after fixing the semiconductor light emitting element to the support member. It is also possible to use a method where the phosphor layer is formed on the semiconductor wafer, and is subsequently cut into chips. It is also possible to use a combination of both of these methods. According to such a configuration, a mixed light made up of light emitted from different kinds of phosphors can be obtained. In order to improve the mixing of light emitted from each fluorescent material and to decrease unevenness of the light, it is preferable that each kind of phosphor has a similar average diameter and shape. Also, it is preferable to arrange the nitride phosphor so it is placed closer to the light emitting element than the YAG phosphor. This is done because of consideration of the nitride phosphor absorbing a portion of light that is a converted wavelength from the YAG phosphor. According to such a configuration, absorption of a portion of the wavelength-converted light of the YAG phosphor by the nitride phosphor can be eliminated. Thus, the color rendering property of the mixed light can be improved compared to the case in which a mixture of a YAG phosphor and a nitride phosphor is included.

Alkaline Earth Metal Halogen Apatite Fluorescent Material

An alkaline earth metal halogen apatite fluorescent material activated with Eu, including at least one element represented by M and selected from Mg, Ca, Ba, Sr, and Zn, and at least one element represented by M' and selected from Mn, Fe, Cr, and Sn, can also be used. This composition enables the production of a light emitting device capable of emitting white light of a high luminance with good mass productivity. Especially, an alkaline earth metal halogen apatite fluorescent material activated with Eu and including at least one of Mn and Cl, has excellent light properties and weatherability. In addition, the fluorescent material can efficiently absorb light in the emission spectrum emitted from the nitride semiconductor. Furthermore, the fluorescent material is capable of emitting a white light, and can adjust the region of the white light range according to its composition. Additionally, the fluorescent material absorbs the ultraviolet rays and emits a yellow or red light having a high intensity. In addition, an example of an alkaline earth metal halogen apatite fluorescent material such as an alkaline earth metal chlorapatite fluorescent material can be included.

In the case of an alkaline earth metal halogen apatite fluorescent material represented by the general formula $(M_{1-x-y}Eu_xM'_y)_{10}(PO_4)_6Q_2$ (wherein M is at least one element selected from Mg, Ca, Ba, Sr, and Zn, M' is at least one element selected from Mn, Fe, Cr, and Sn, Q is at least one element selected from F, Cl, Br, and I, $0.0001 \leq x \leq 0.5$, $0.001 \leq y \leq 0.5$) or the like, the light emitting device is capable of emitting mixed light and can be obtained with a good mass production efficiency.

Furthermore, in addition to the alkaline earth metal halogen apatite fluorescent material, in the case when at least one kind of fluorescent material selected from $BaMg_2Al_{16}O_{27}:Eu$, $(Sr,Ca,Ba)_5(PO4)_3Cl:Eu$, $SrAl_2O_4:Eu$, $ZnS:Cu$, $Zn_2GeO_4:Mn$, $BaMg_2Al_{16}O_{27}:Eu,Mn$, $Zn_2GeO_4:Mn$, $Y_2O_2S:Eu$, $La_2O_2S:Eu$, and $Gd_2O_2S:Eu$ is included, a subtle adjustment of light color tone becomes possible. Further, a white light with an excellent color rendering property can be achieved with a relatively easy configuration. In addition, the fluorescent material can include Tb, Cu, Ag, Au, Cr, Nd, Dy, Co, Ni, Ti and Pr, or the like, in addition to Eu.

Also, the particle diameter of the fluorescent material used in the present invention is preferably in the range of from 1 $\mu$m to 100 $\mu$m, and more preferably in the range of 15 $\mu$m to 30 $\mu$m. A fluorescent material having the particle diameter of less than 15 $\mu$m tends to form an aggregation, and is densely settled down in a liquid resin, thereby decreasing the transmission efficiency of the light.

In the present invention, such an obstruction of light by the fluorescent material is prevented by employing a fluorescent material that does not have this tendency and thereby this improves the output of the light emitting element. Furthermore, a fluorescent material having a particle diameter in the range of the present invention has excellent properties for light absorption and light conversion efficiency, and has a broad excitation wavelength. Thus, by including a fluorescent material with a large particle diameter having excellent optical properties, it is also possible to efficiently convert wavelengths near the peak wavelength of light emitted from the light emitting element.

Here, the particle size in the present invention indicates the value obtained from the mass base particle size distribution. The mass base particle size distribution is obtained by measuring the particle distribution by means of a laser diffraction scattering method. Specifically, when the ambient temperature is 25° C. and the moisture content is 70%, each material is dispersed in a hexametaphosphoric acid having a concentration of 30%. The particle size distribution is then measured with a laser diffraction scattering-type device (SALD-2000A, Shimadzu Corp.) in a particle size range from 0.03 $\mu$m to 700 $\mu$m. The median diameter in the present specification indicates the particle size at the cumulative size distribution value of 50% in the mass base particle size distribution. The median diameter of the fluorescent material used in the present invention is preferably from 15 $\mu$m to 50 $\mu$m. Also, it is preferable to include a fluorescent material having a median diameter with the abovementioned range with a high frequency rate, preferably from 20% to 50%. By using such a fluorescent material having a small degree of fluctuation in particle diameter as just described, lack of uniformity in the distribution of the light color can be prevented, and a light emitting device capable of emitting favorable color tones of light can be obtained.

Also, it is preferable for the fluorescent material to have a shape similar to that of a dispersing agent used in the present invention. The term similar shape as used in the present specification means the difference in the deviation from circular (deviation from circular=circumference of a circle having equal area to the projected area of a particle/peripheral length of projection of a particle) among the particles is less than 20%. The deviation from circular indicates the degree of approximation away from a perfect circle. Accordingly, the light diffused by a dispersing agent and the light emitted from the excited fluorescent material are mixed in an ideal state, thereby a more uniform emission can be achieved.

Process 5: Separation Into Each Light Emitting Device

Next, each connecting part of the lead frame to each electrode is cut to form separate individual light emitting devices. Furthermore, where the package 1, such as is shown in FIG. 3A or FIG. 6, is formed through the use of a hanger lead which supports the package at the previously formed side recess 9 of the package, the support of the lead frame is removed after forming. Using the hanger lead enables the forming process to be carried out on each pair of electrodes simultaneously, thus decreasing the number of steps to form the light emitting device and increasing productivity.

Process 6: Forming the Lead Electrode 2

Next, the positive and negative electrodes protruding from the end face of the package 1 are bent along the side face of the package so that the J-bend type contact terminals are formed. Here, the contact terminal of lead electrode 2 is a portion of the lead electrode in contact with the conductive pattern of the mounting base and this allows the electric connection.

In the case where the positive lead electrode and the negative electrode protrude from the end faces of the minor axis sides of the main surface of the package in the present embodiment, it is preferable to bend the protruding portion toward the back side of the package, opposite from the main surface (see for example, FIG. 1A). This avoids a harmful effect on the emission side from the molding solder and the mounting of the light emitting device to the wiring base can be carried out. Also, a pair of positive and negative lead electrodes 2 are inserted so as to protrude from the end face of the long axis side of the main surface of the package 1. By bending the protruding portion of the lead electrodes toward the faces perpendicular to the emission face (see for example, FIG. 4A), the contact surface area of the connection terminals and the conductive pattern placed on the mounting base can be increased. This arrangement enables a secure electric connection and accuracy in mounting.

Also, by bending the protruding portion of the lead electrodes, the light emitting device can be prevented from being pushed up from a temporary mounting face at the time when the reflow process is carried out such that the light emitting device is temporarily mounted to the mounting base. When the connection terminal portions are formed by bending the lead frames in this way, it is preferable that the wall face of the molding member on the mounting face side and the exposed faces of the lead electrodes are arranged so as to be on approximately the same plane. According to this configuration, the light emitting device can be mounted stably on the mounting base member.

Also, the structure of the contact terminal portion is not limited to the J-bend type and it may be made to have other structures such as a gull-wing type.

In the present embodiment, the area around the side faces where the lead electrodes are exposed, are preferably formed with a tapered shape which is tapered with predetermined angles, as shown in FIG. 3 and FIG. 6. Thus, by bending the lead electrodes 2 to such an extent to be close to the side faces because of the elasticity of the lead electrode 2, the connection terminal portion can be easily formed with any desired angle that is designed for stable mounting of the light emitting device.

The light emitting device of the present embodiment can be produced according to the above described processes.

The light emitting device thus formed is placed on the mounting base with a predetermined spacing to establish the electric conduction. It is preferable that the base member for the wiring base have excellent thermal conductivity, and an aluminum-based substrate, a ceramic-based substrate, or the like. In addition, where the surface of a substrate has a low thermal conductivity, such as a glass epoxy substrate or a paper phenol substrate, it is preferable to provide for heat release, by using a thermal pad, a thermal via, or the like. Also, electric conduction can be established between the light emitting diode and the wiring base by means of a conductive member, such as a solder. It is preferable to use a silver paste when taking the thermal release into consideration.

Translucent Member

In the present invention, a configuration capable of accurately fitting in the light entrance portion of the translucent member such as a lens or an optical guide plate made of a rigid-type translucent resin or glass or the like, can be made on the emission side or the light receiving side of the light emitting device. Here, "the light entrance-emitting portion" in the present specification is formed in the translucent member which directs light in a desired direction from the semiconductor device or directs light to the semiconductor device, and is a portion wherein the light from the semiconductor device enters. In some cases, this portion is called the "light entrance portion". It is also a portion where the light is emitted toward the semiconductor device (in some cases, it is called the "emission portion").

The translucent member in the present embodiment is a member where the reflection and refraction of light is used for guiding the incident light introduced in the member emitted from the light emitting device, in a predetermined direction. The translucent member also releases the light introduced into the translucent member, while adding a predetermined intensity distribution to the light. Also, the translucent member in other embodiments is a member which condenses light from the outside of the photo acceptance device which enters the translucent member in the direction of the photodetector.

Especially in the present embodiment, the translucent member used in the light emitting device has portions which individually introduce the incident light emitted from the light emitting device. The inner wall of the portion introducing the light has at least a mounting face contiguous with the first main surface, and a second mounting face contiguous with the second main surface of the light emitting device of the present mode. In addition, the portion introducing the incident light can be configured to fit the notched portion 13 formed on the main surface of the light emitting device shown in FIG. 5.

As described above, according to the present invention, a light source having desired optical properties can be produced with a good process yield, by having the molding member capable of producing substantially constant shapes at all times, and by providing a configuration on the surface of the molding member which enables positioning with other translucent members.

Planar Light Source

The light source comprising an optical guide plate and a light emitting device may be a planar light source. In this planar light source, light enters from the light introducing portion at the side face of the optical guide plate and is released from another side face.

The optical guide plate of the present embodiment is a tabular translucent member, which uses the reflection of light on the inner wall of the member to guide the light from the light emitting device in a predetermined direction and release the light from the predetermined face to the outside of the tabular translucent member. Particularly, the optical guide plate of the present embodiment is a tabular optical guide body having a light releasing face which can be used as a planar light source for a backlight in a liquid crystal display, or the like.

As for the material for the optical guide plate, it is preferable to have excellent light permeability and good molding properties. An organic member such as an acrylic resin, a polycarbonate resin, an amorphous polyolefin resin, polystyrene resin, or the like, or an inorganic member such as glass or the like, can be used. In addition, it is preferable that the surface of the optical light guide plate have a profile irregularity of not more than 25 μm (cf. Japanese Industrial Standard).

Such an optical guide plate is installed so as to arrange the mounted face so that it sets the light introducing portion opposite to the main surface of the light emitting device. As for the installing method of the optical guide plate, a method such as fastening with a screw, adhesive bonding, welding, or the like, which is capable of easily positioning and secure bonding, can be used. The particular method can be selected according to a desired specification or requirement.

In the present embodiment, the second main surface of the package and the end face of the optical guide plate can be fastened together by an adhesive. Also, a diffusion sheet can be provided above the planar light source of the present invention. Thus, the present invention can be used as a light source for a direct type back light which illuminates other members such as a diffusion sheet or the like. The selection of the diffusion sheet has a decisive influence on the thickness and performance of the optical guide plate. Therefore, selection and evaluation of the diffusion sheet is preferably carried out in each case, according to the desired specification and requirements.

In the present embodiment, a diffusion sheet of about 100 μm in thickness, haze value of from 88% to 90% is used for a polycarbonate optical guide plate of 20 mm in thickness with excellent thermal resistance. Thus, unevenness of the light distribution between each of the light sources can be reduced and a uniform emission can be achieved. Such a diffusion sheet can be loaded on the optical guide plate directly or by means of welding. Also, when a cover lens is placed above the light source, the diffusion sheet can be fixed by placing it between the cover lens and the optical guide plate. The distance between the diffusion sheet and the optical guide plate is preferably from 0 mm to 10 mm. PET is most commonly used as the material for the diffusion sheet. However, the diffusion sheet is not limited to this material except that it should have a resistance against deforming or deteriorating due to heat generated by the light emitting diode.

The planar type light source thus obtained is capable of emitting light which is uniform and high in luminance over the entire area.

EXAMPLES

The following examples further illustrate the present invention in detail but are not to be construed to limit the scope thereof.

Example 1

Figure 1B:
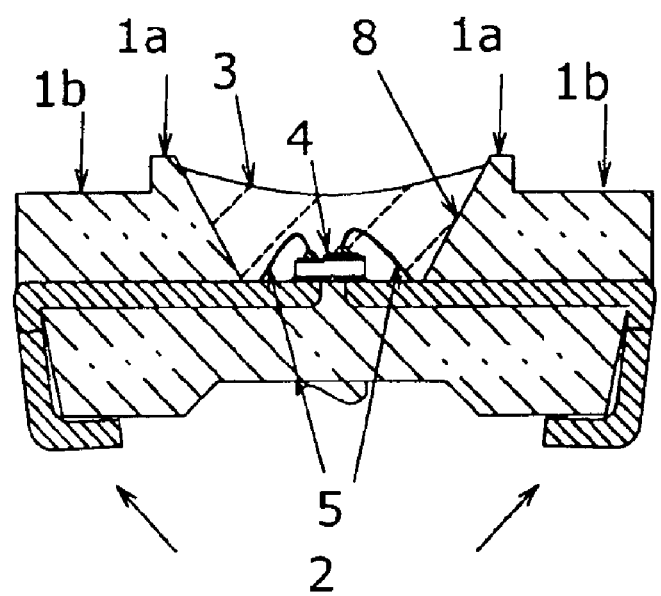
Figure 2A:
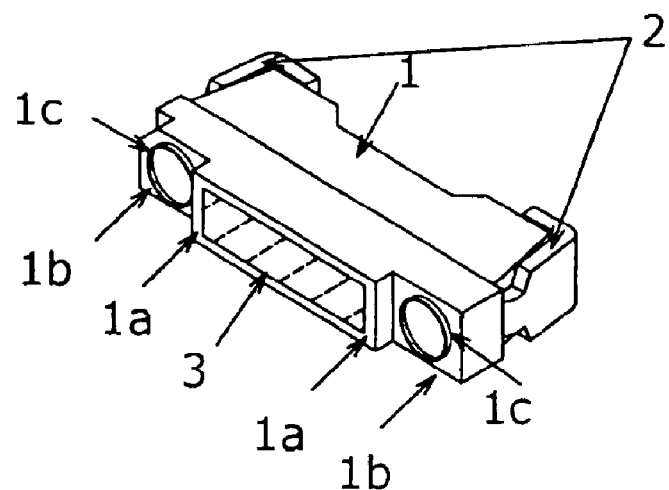
FIG. 2A is a schematic perspective view and FIG. 2B is a schematic cross sectional view of the light emitting device according to another embodiment of the present invention.
Figure 2B:
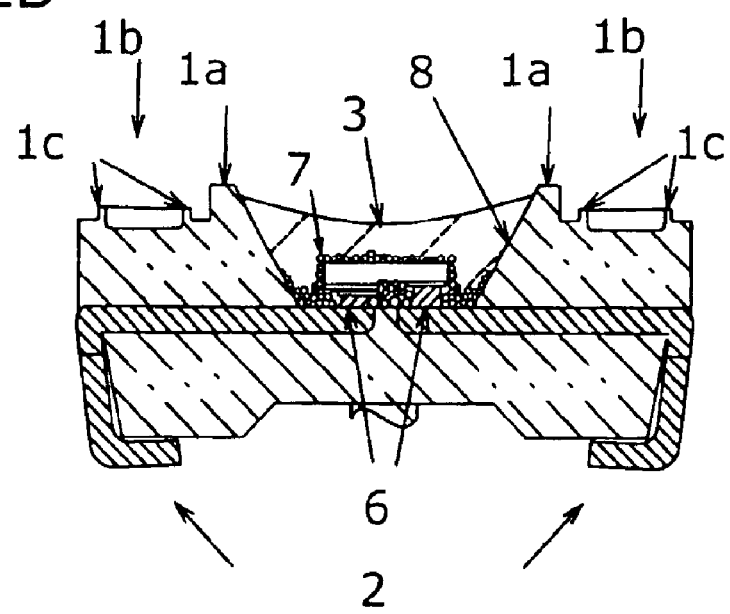

A surface mounting type of light emitting device is shown in FIGS. 1A and 1B. The light emitting element 4 is a nitride semiconductor element having an active layer of an $In_{0.2}Ga_{0.8}N$ semiconductor with a monochromatic emission peak being a visible color of 475 nm. In more detail, the light emitting element 4 of the LED chip is made by flowing TMG (trimethyl gallium) gas, TMI (trimethyl indium) gas, nitrogen gas and a dopant gas together and forming a gallium nitride semiconductor layer in a MOCVD process. The layers of the N-type nitride semiconductor or the P-type semiconductor are formed by switching between $SiH_4$ and $Cp_2Mg$ as the dopant gas.

Figure 8:
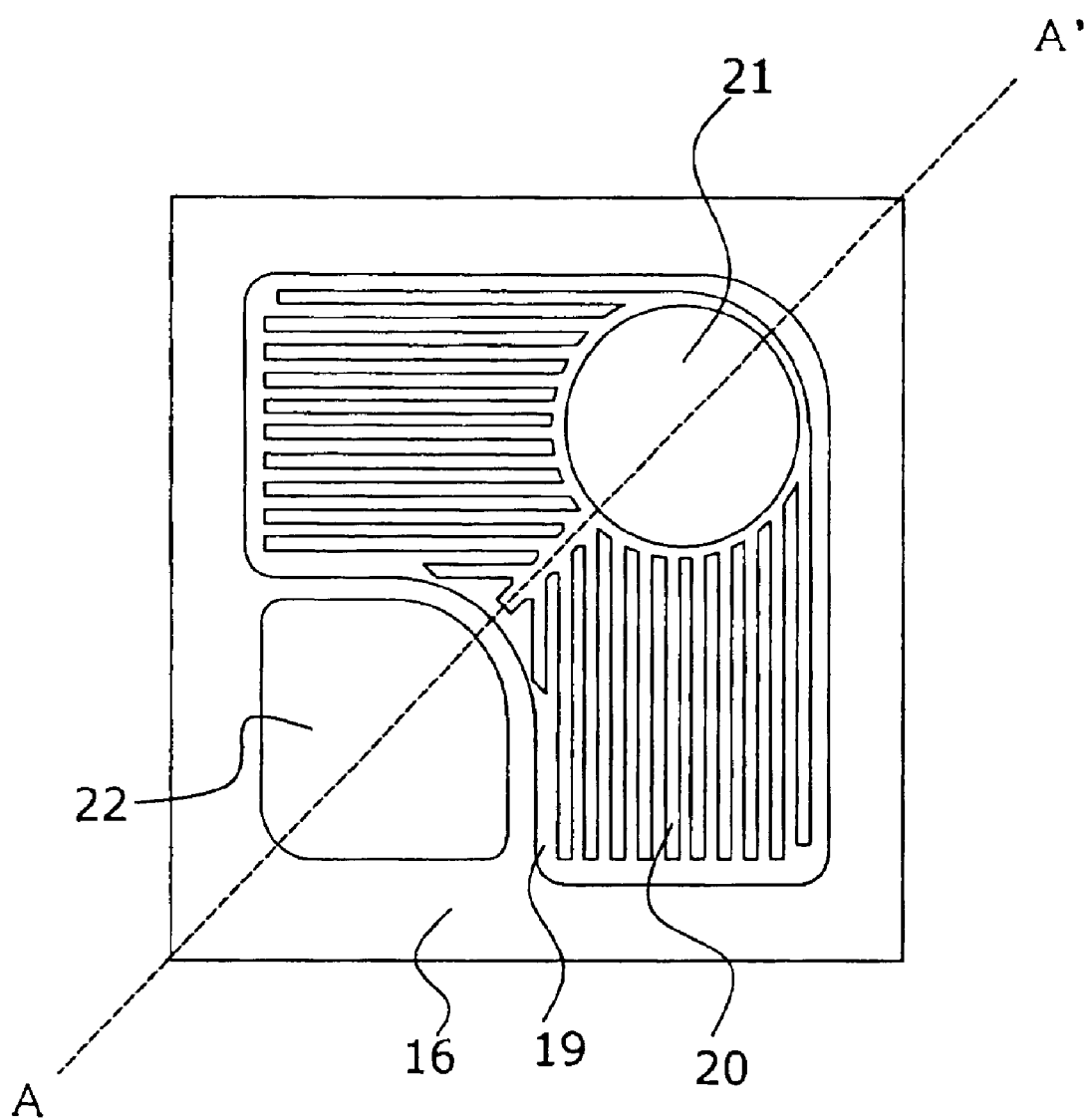
FIG. 8 is a schematic top view of the semiconductor light emitting element according to an embodiment of the present invention.
Figure 9:
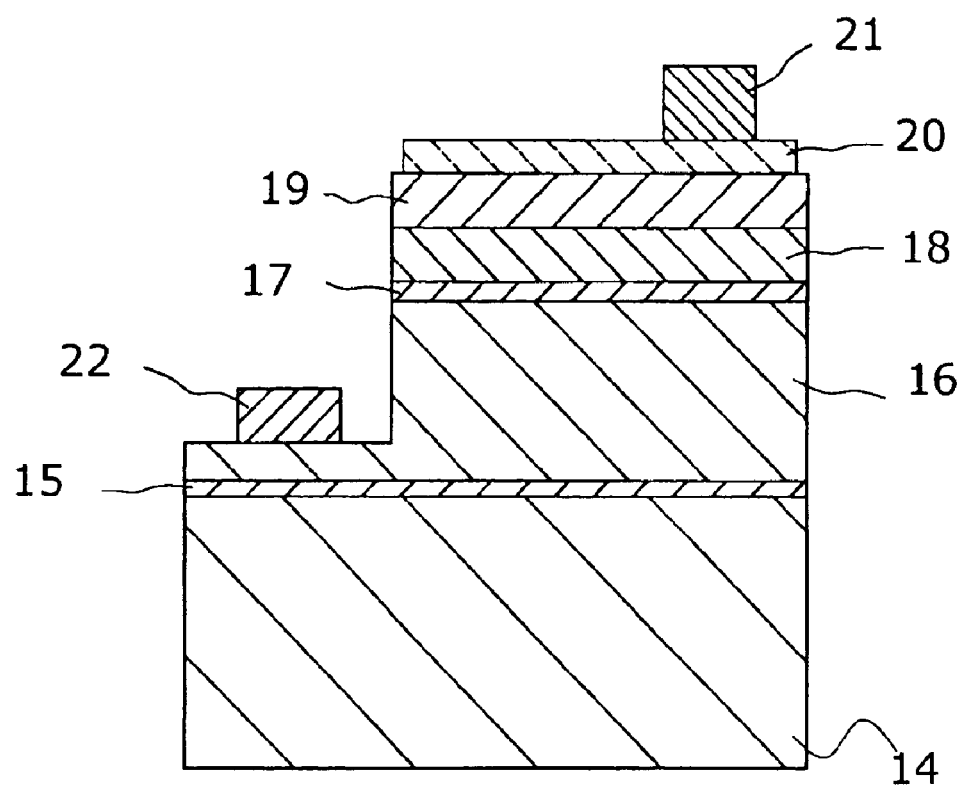
FIG. 9 is a schematic cross sectional view of the semiconductor light emitting element according to the embodiment of the present invention shown in FIG. 8.

FIG. 8 is a plan view of an LED chip of the present embodiment and FIG. 9 is a schematic cross sectional view of the LED chip taken along the broken line AA' in FIG. 8.

The elemental structure of the LED chip of the present example is sequentially formed on a sapphire substrate 14. The layers include a GaN buffer layer of undoped nitride semiconductor, a Si doped N-type GaN contact layer 16 providing an N-type electrode thereon, a GaN layer of undoped nitride semiconductor, and an active layer 17 having a multi-quantum-well structure comprising 5 sets of sequentially formed layers of a GaN barrier layer and an InGaN well layer, and a GaN barrier layer on top of the 5 sets of layers. Also, an AlGaN layer 18 as a Mg-doped P-type cladding layer and a P-type GaN layer 19 as a Mg-doped P-type contact layer are sequentially formed on the active layer 17. Furthermore, the GaN buffer layer 15 is formed on the sapphire substrate 14 using a low temperature. Also, after forming the layers, the P-type semiconductor is annealed at greater than or equal to 400° C.

The surfaces of the P-type contact layer 19 and the N-type contact layer 16 of the nitride semiconductor on the sapphire substrate are exposed by etching them on the same face side. Next, sputtering is performed on the P-type contact layer 19 using Rh and Zr. Thus a diffusion electrode 20 having a pattern such as shown in FIG. 8 is formed. The diffusion electrode 20 comprises two different types of stripes. One type of stripe stretches outwardly toward an outer edge of the LED chip from a portion where the P-side seat electrode 21 is formed. Another type of stripe stretches toward the outer edge of the LED chip and has branched out part way along the first type of stripe.

In further detail, the diffusion electrode 20 according to the present embodiment comprises two groups of stripes. The first group includes a number of stripes extending parallel to two outer edges of the chip and they are joined to each other in the vicinity of the p-side seat electrode 21. The second group includes a diagonal portion extending along the diagonal line AA' from the P-side seat electrode 21 and two groups of stripes branching out from the above diagonal portion. These two groups of stripes each extend parallel to the two outer edges discussed above. By making the diffusion electrode 20 in this manner, the electron current flow in the diffusion electrode 20 spreads out over a wide area on the p-type contact layer 19. Thus, the luminous efficiency of the LED chip can be enhanced.

Further, sputtering processes using W, Pt, and Au are carried out on the diffusion electrode 20 and a portion of the N-type seat electrode 22, to sequentially form the layers of W/Pt/Au in this sequence. This allows concurrent formation of the P-side seat electrode 21 and N-side seat electrode 22. Here, by concurrently forming the P-side seat electrode 21 and N-side seat electrode 22, the number of process steps for forming the electrodes can be reduced.

In addition, the P-side pad electrode 21 can also be formed on a portion of the translucent electrode, after forming an ITO (complex oxide of indium (In) and tin (Sn)), a metallic thin film of Ni/Al, or the like, as a translucent electrode on the entire surface of the P-type nitride semiconductor.

After scribing, the semiconductor wafer has been made as described above and each LED chip (refractive index of 2.5)

of the semiconductor light emitting element is made by dividing the wafer with an external force.

Punching is carried out on a long metal frame of copper which contains iron, which is 0.15 mm in thickness. The frame is made to include a plurality of pairs of positive and negative electrodes. A pair of positive and negative electrodes will be inserted into each package. In addition, Ag plating is carried out on the surface of the lead frame in order to improve the optical reflectivity.

Next, a pair of positive and negative electrodes 2 are preset in the die and then a molten polyphthalamide resin is poured in. The resin passes through a gate which is set toward the bottom of the package 1. Thereafter, the resin hardens and the package shown in FIG. 1A is formed.

The package is integrally molded so as to have a recess capable of housing the light emitting element, and exposing a surface of either of the positive or negative electrodes in the bottom of the recess. Further, the main surface side of the package has a step formed in the main surface of the side wall. The first main surface 1a is adjacent the recess and the second main surface 1b is adjacent to and offset from the first main surface 1a. In addition, the lead electrodes 2 respectively protruding from the side of the package in the minor axis direction, are folded inwardly around a backside of the light emitting diode. The backside is the reverse side from the main surface of the package 1.

The LED chip is fixed to the main surface of the lead electrode 2 by epoxy resin. The package 1 is formed so that the main surface of the lead electrode 2 is exposed in the bottom of the recess. Then, the electrode of the fixed LED chip and the respective electrodes exposed in the bottom of the recess of the package 1 are connected by means of conductive wires 5 which are mainly made from Au.

Next, the sealing member 3 is prepared. First, 3 wt % of magnesium carbonate light (having a refractive index of 1.62, an average particle size of 1.0 $\mu$m, an oil absorption of 70 ml/100 g as a diffusion agent (refractive index of 1.62)) is included into 100 wt % content of phenyl methyl silicon resin (having a refractive index of 1.53). The material is mixed by a rotation-revolution mixer for 5 minutes. Next, the resin material stands for 30 minutes at room temperature to release the heat generated by the agitation and to stabilize the resin material.

The curing material obtained according to the method described above is filled in the recess of the package 1 up to a level even with the top surface of the recess. Finally, a heat treatment is carried out on the curing material at 70° C. for 3 hours, and then at 150° C. for 1 hour. By this heat treatment, the emission surface forms a depression having a shape that is approximately a symmetrical parabola when viewed along the top surface toward its center. In addition, the sealing member 3 comprises a hardened curing material which is divided into two layers. The first layer is high in diffusion agent and the second layer is either low or has no diffusion agent.

The surface of the LED chip is covered with the first layer. The first layer is preferably continuously formed from the bottom of the recess to the surface of the LED chip. This arrangement achieves a high light extraction efficiency for the light emitted from the LED chip as well as an excellent uniformity in light.

The light emitting device thus obtained is capable of accurately loading all sorts of optical members on its main surface.

Example 2

FIGS. 2A and 2B, FIGS. 3A and 3B, and FIGS. 4A and 4B show the light emitting devices in the present example.

The light emitting devices are made in the same manner as in Example 1 except for having an outer circular wall 1c on the second main surface 1b of the package 1.

The light emitting device of the present example has an excellent reliability and a high quality attachment formed by bonding the LED to other members using an adhesive agent disposed inside the outer wall 1c while at the same time preventing the adhesive agent from flowing out past the outer wall into the recess.

Example 3

FIGS. 2A and 2B, FIGS. 3A and 3B, and FIGS. 4A and 4B show the light emitting devices in the present example. The light emitting device is made in the same manner as the other examples of the present invention, except for forming a Au bump on the electrode of each LED chip, and employing a flip-chip method wherein ultrasound bonding is carried out so as to make the electric connection with each lead electrode that is exposed in the bottom of the recess of the package.

The light emitting device of the present example can achieve similar effects described in the above examples, and moreover, the heat releasing and light extracting properties can be enhanced.

Example 4

FIGS. 2A and 2B, FIGS. 3A and 3B, and FIGS. 4A and 4B show the light emitting devices in the present invention. In Example 4, a light emitting device was made in the same manner as in Example 3 except for adding the fluorescent material 7 in the molding member.

The fluorescent material is made by dissolving rare earth elements of Y, Gd, and Ce in an acid in stoichiometric proportions, and then coprecipitating the solution with oxalic acid. The oxide of the coprecipitate obtained by firing this material is mixed with aluminum oxide to obtain a raw material mixture. The mixture was then mixed with barium fluoride used as a flux, and fired in a crucible in air at 1400° C. for 3 hours to obtain the fired material. Then the fired material is ground by a ball mill in water, washed and separated, dried, and finally sieved, thereby obtaining a fluorescent material having a main diameter of 8 $\mu$m, and which is represented by the general formula $(Y_{0.995}Gd_{0.005})_{2.750}Al_5O_{12}:Ce_{0.250}$.

After 5.5 wt % of the fluorescent material (refraction index of 1.84) is added to the silicone resin composite (refraction index of 1.53), the composite is mixed by a rotation-revolution mixer for 5 minutes. The curing material obtained in this manner is filled in the recess to a level even with the top surface of the recess. Finally, a heat treatment is carried out for the composite at 70° C. for 2 hours and then at 150° C. for 1 hour.

The light emitting device thus produced is capable of emitting mixed light of light emitted from the light emitting element and fluorescent light emitted from the fluorescent material which absorbs the light emitted from the light emitting element and emits light in a different wavelength. Also, an emission surface having a depression with a shape that is approximately a symmetrical parabola when viewed along the top surface toward its center, can be obtained according to the above described manner. When this device is used in combination with the optical guide plate, the efficiency of introducing the incident light to the optical guide plate is improved.

Example 5

Figure 4A:
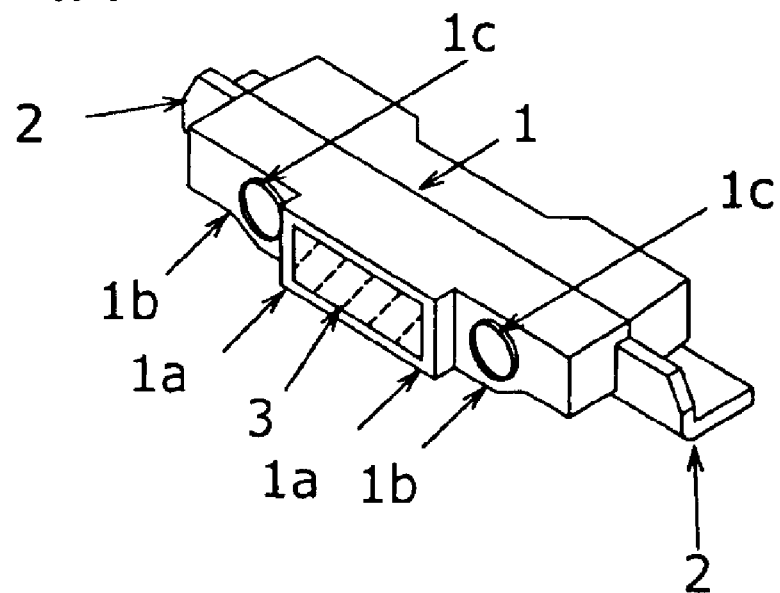
FIG. 4A is a schematic perspective view and FIG. 4B is a schematic cross sectional view of the light emitting device according to still another embodiment of the present invention.
Figure 4B:
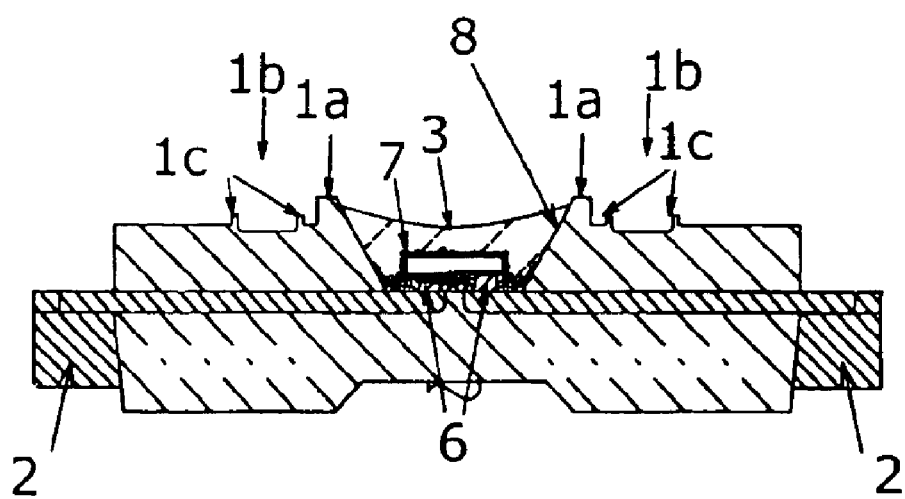

The light emitting device of this example is made in the same manner as in the other examples except for exposing the positive and negative electrodes from the side faces of the long axis side of the package, and bending or folding the exposed face perpendicular to the emission face (see for example, FIG. 4A).

The light emitting device of the present example can be mounted to the mounting base with good stability.

Example 6

Figure 5:
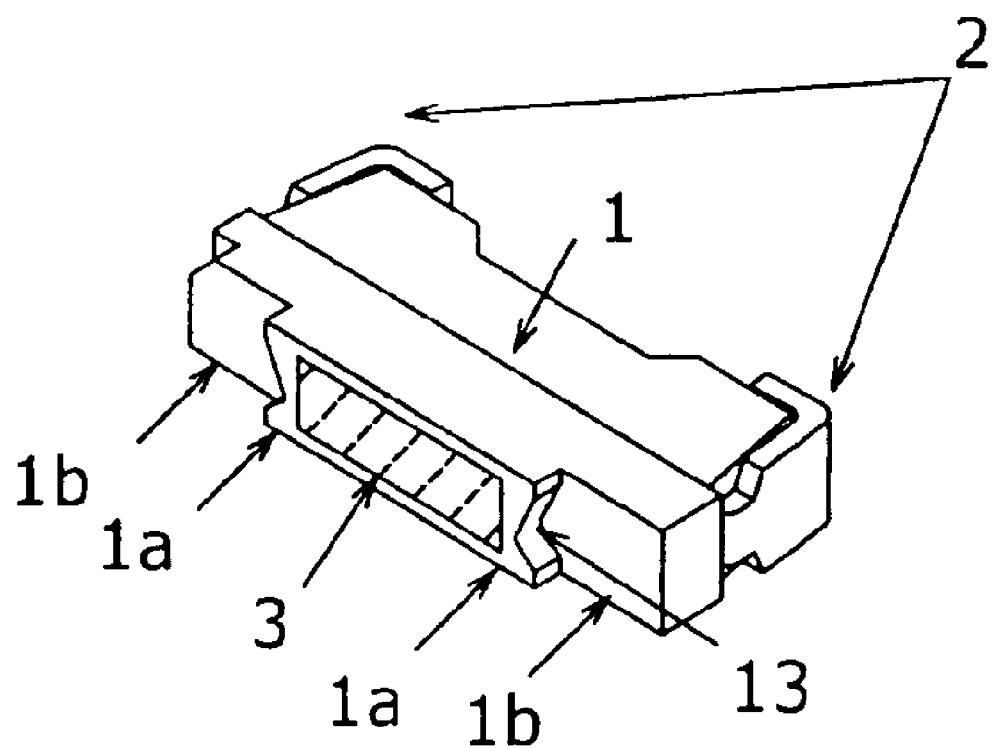
FIG. 5 is a schematic perspective view of the light emitting device according to another embodiment of the present invention.

As shown in FIG. 5, the light emitting device of this example is made in the same manner as in the other examples except for forming a notch 13 along an edge of the first main surface.

The light emitting device of the present example enables an improved accuracy in attaching and mounting the LED to other members.

Example 7

Figure 10:
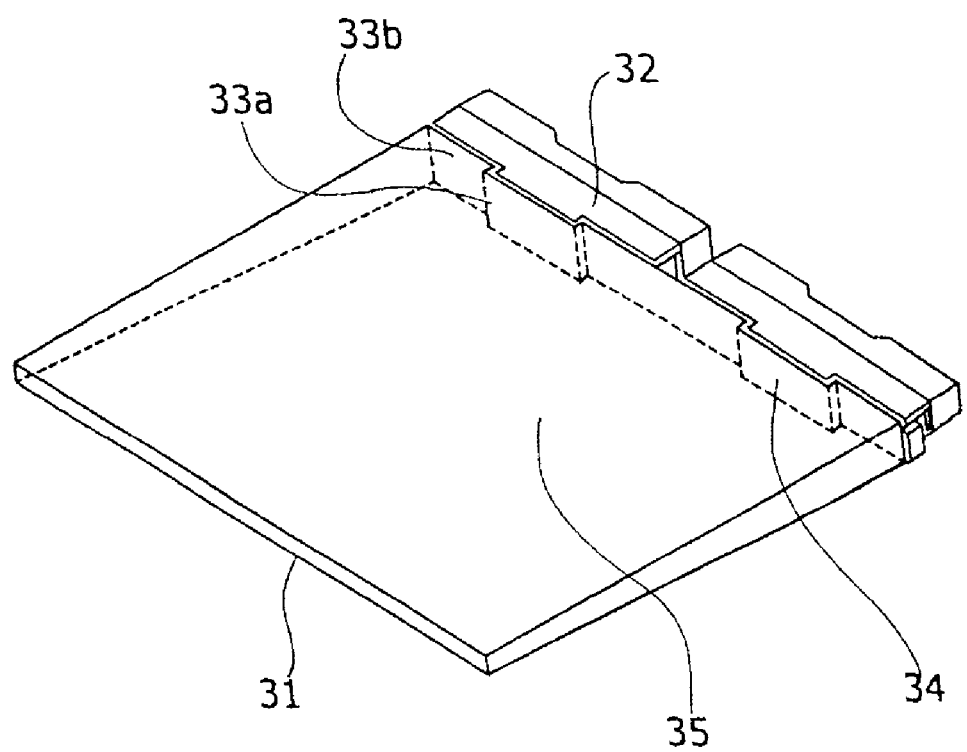
FIG. 10 is a schematic perspective view showing two light sources mounted on a light guide plate according to an embodiment of the present invention.
Figure 11:
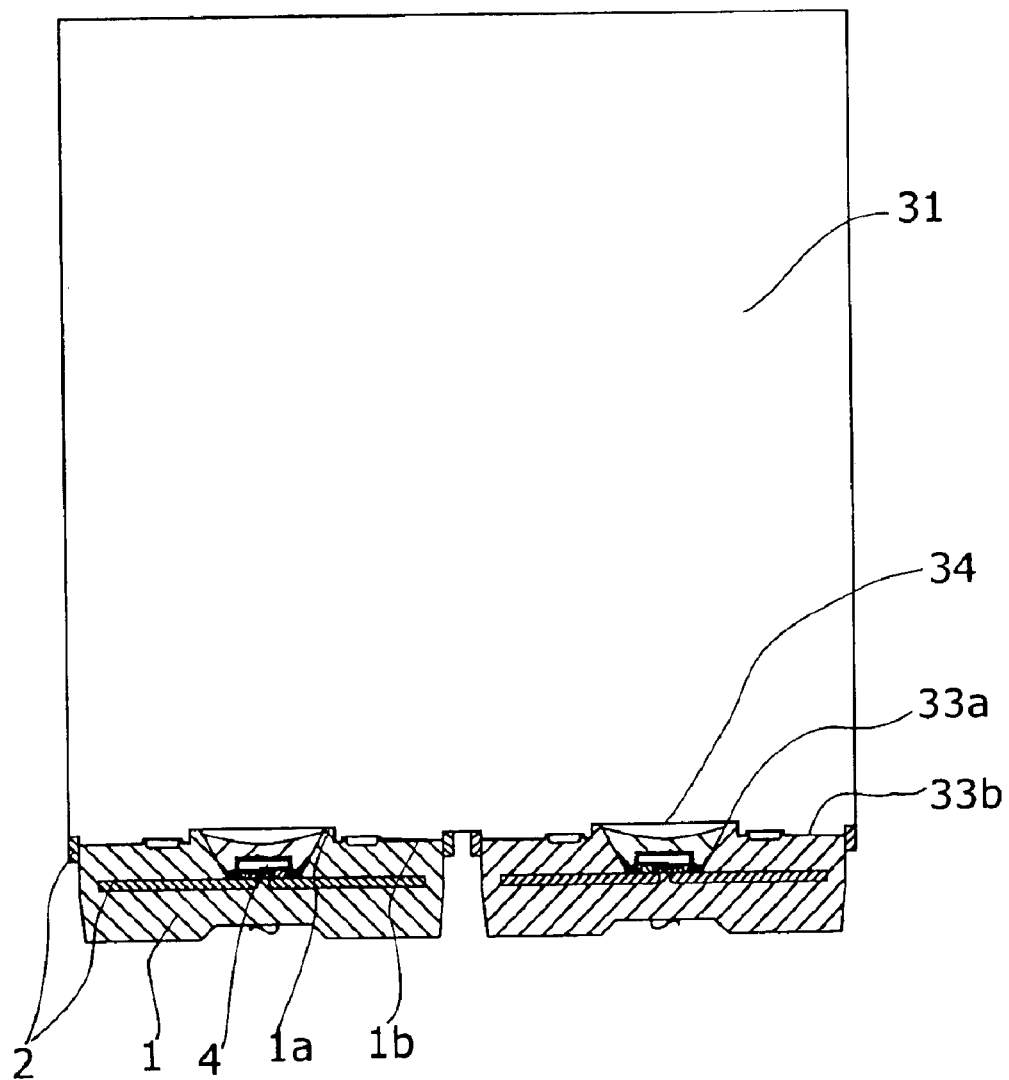
FIG. 11 is a schematic cross sectional view of the light device according to the embodiment shown in FIG. 10.

FIG. 10 shows a schematic perspective view and FIG. 11 shows a schematic cross sectional view of an example of the planar light source in the present example.

The planar light source of the present example comprises light emitting devices 32 that are made in a similar manner as described in the other examples and the optical guide plate 31, which is a translucent member made of an acrylic resin.

The optical guide plate 31 of the present example has a portion for receiving incident light 34 on one side face. This side face introduces light emitted from a plurality of light emitting devices 32, and illuminates the planar light emitting portion 35 on another side face using reflection inside the optical guide plate 31. The wall 34 for introducing incident light comprises a first mounting face 33a which is contiguous with the first main surface 1a, and a second mounting face 33b which is contiguous with the second main surface 1b of the light emitting device 32. In addition, the wall 34 for introducing incident light may include a prism shape (not shown) so as to broadly introduce the light from the light emitting device to the optical guide plate 31.

The planar light source of the present example has an excellent reliability and allows flexibility in mounting by using a molding member which maintains a regular shaped LED for positioning with the optical guide plate.

Example 8

Figure 12:
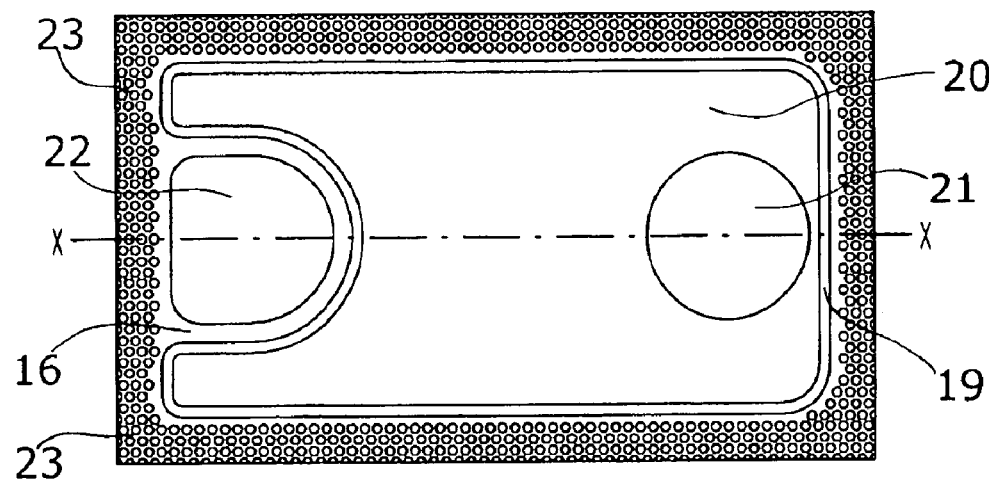
FIG. 12 is a schematic plan view of a semiconductor light emitting element according to one of the examples of the present invention.
Figure 13:
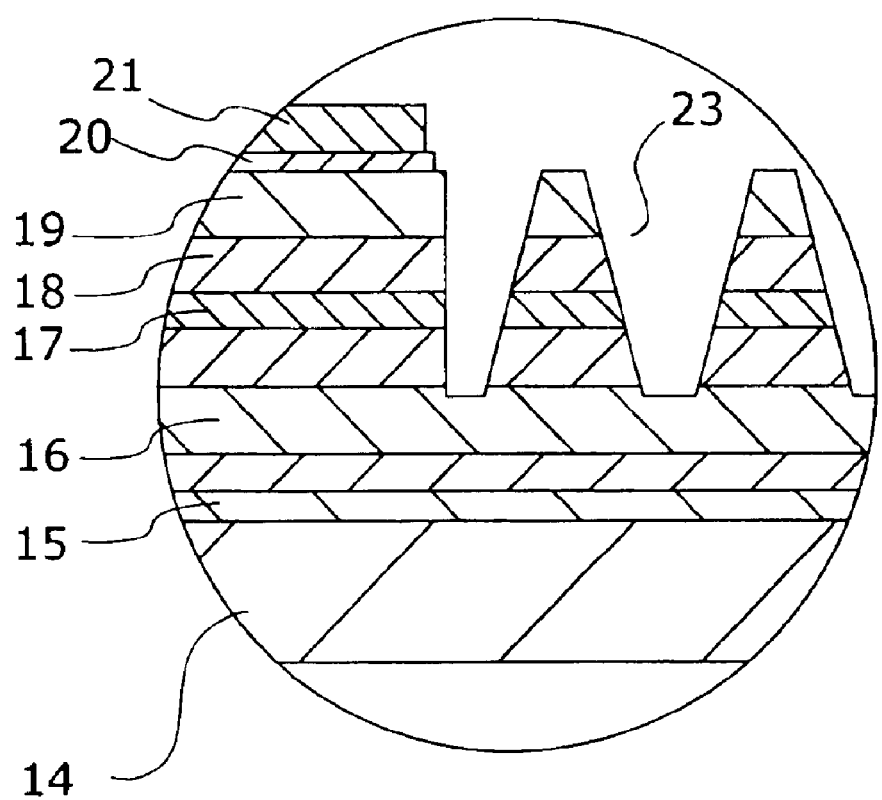
FIG. 13 is a schematic cross sectional view of a semiconductor light emitting element according to another example of the present invention.

The semiconductor element of the present example is described according to FIGS. 12–13. FIG. 12 is a plan view of the semiconductor element of the present example which is viewed from the side on which the electrode is formed. FIG. 13 is a cross sectional view in the vicinity of the pad electrode 21 along dotted line X–X' in FIG. 12. FIG. 13 shows the physical relationship between the semiconductor laminated structure in the first region wherein the P-side pad electrode 21 is placed and the protrusions 23 are formed in the second region.

The semiconductor element of the present example has the P-side pad electrode 21 and the N-side pad electrode 22 on the same face side, and light is extracted from the same face side where the electrodes are placed. The semiconductor laminated structure of the semiconductor element has a multi-layer structure as is similar to the other examples. The laminated structure includes a GaN buffer layer 15 on the sapphire substrate 14, a non-doped GaN layer, a Si-doped GaN layer as the N-type contact layer 16, a Si doped GaN layer as the N-type cladding layer, an InGaN layer as the active layer 17, a Mg doped AlGaN layer as the P-type cladding layer 18, and a Mg doped GaN layer as the P-type contact layer 19, in sequence.

In addition, a Mg doped GaN layer, a Mg doped AlGaN layer, an InGaN layer, a Si doped GaN layer, and a Si doped GaN layer are partially removed by way of etching or the like. The N-side pad electrode 22 is placed on the exposed face of the Si-doped GaN layer 16, and the P-side pad electrode 21 is placed on the Mg doped GaN layer.

The N-side pad electrode 22 comprises multiple layers of W, Pt, Au, formed in sequence from the N-type contact layer side. The diffusion electrode 20 has the P-side pad electrode 21 placed thereon and it is formed on the approximately the entire surface of the P-type contact layer 19. Layers of Ni and Au (or an alloy of Ni and Au) are formed in sequence from the P-type contact layer side. The P-side pad electrode 21 comprises layers of W, Pt, Au in the same way as the N-side electrode. In addition, the diffusion electrode 20 partially surrounds the N-side pad electrode 22 in order to secure the light emitting region.

The N-type contact layer 16 comprises a first region having the semiconductor multi-layer structure with the P-side pad electrode 21 thereon, and a second region that is different from the first region. The second region includes the N-side pad electrode 22 and the plurality of protrusions 23. As shown in the cross sectional view of the semiconductor light emitting element in FIG. 13, the top portion of each protrusion 23 formed in the second region is disposed in the P-type contact layer 19 as opposed to the active layer 17. That is, the top portion of a protrusion 23 is formed so as to be higher than the active layer 17.

The semiconductor light emitting element of the present example is of a DH structure, so that the height of the top portion of a protrusion 23 is higher than the active layer and its interface with the adjacent N-type semiconductor layer. However, it is more preferable for the top portion of the protrusion 23 to be higher than the active layer 17 and its interface with the adjacent P-type semiconductor layer.

According to such a configuration, the light emitted from the active layer 17 in the direction of the end face (or side face) hits the protrusion 23 which enables it to change direction toward, for example, the observing surface of the electrode forming face side. In addition, the light emitted from the end face is scattered from the side face by a plurality of protrusions 23, so that effective light extraction and directional control of the light can be achieved.

In addition, light guided through the N-type contact layer 16 is reflected diffusely from the bottom of the protrusion 23 (a junction between the N-type contact layer 16 and the protrusion 23), so sufficient light extraction can be achieved. In addition, the light introduced from the N-type contact layer 16 to the interior portion of the protrusion 23 can be emitted from the top portion or the middle portion of the protrusion 23. Specially, the semiconductor light emitting element of the present example has properties which allow the light emitted from the active layer 17 to change directions toward the end face (side face) by the protrusion 23 and so directional control of the light can be sufficiently achieved.

Furthermore, the effect described above can be enhanced by attenuating the width of the protrusion 23 in the direction of the semiconductor multi-layer structure, which is the N-type contact layer 16 side toward the P-type contact layer 19 side. That is, by intentionally inclining the side face of the protrusion 23, the light from the active layer 17 is totally reflected by the side face of the protrusion 23, and the light guided though the N-type contact layer 16 is scattered, thereby enabling effective light extraction toward the emission observing surface side. The inclination of the protrusion 23 is preferably from 40 to 80, more preferably from 50 to 70, and most preferably from 60 to 65. The same effect can be achieved in the case where the cross sectional view of the protrusion is a trapezoid.

In addition, the protrusion 23 preferably has approximately the same angles on the side closer to the first region and the side further from the first region. The reason for this condition has not been clear yet, however, it is considered that by having the same inclinations, uniform light extraction and directional control of light can be achieved. It is preferable to form the inclinations in the ranges as described above.

In addition, the outline of the cross sectional view of the protrusion is preferably a trapezoid. That is, the shape of the protrusion itself is a frustum of a cone. According to such a configuration, directional control of light can be easily achieved as well as uniform light extraction. It is considered that in the case where the light is extracted from the P-type contact layer side 19, and the P-side contact layer 19 is the observing face, this effect can be achieved by making the observing face side of the protrusion have planes and not points.

In addition, in the case where the outline of the cross sectional view of the protrusion is a trapezoid, the top portion of the trapezoid (P-side) can have a recess. This is preferable because the recess formed on the top of the protrusion allows the light guided through the N-type contact layer which passes through the protrusion to be emitted in the direction of the observing surface side.

In addition, in the semiconductor element of the present example, it is preferable that two and more preferably more than three protrusions are formed which are at least partially overlapped, in a direction perpendicular to the light emitting end face of the semiconductor multi-layer structure formed in the first region of the N-type contact layer 16. According to such a configuration, the light emitted from the first region is guided through the protrusion 23 with a high probability and thus the above described effect can be easily achieved.

The protrusion 23 in the present embodiment is preferably formed during the same time of the process when the N-type contact layer 16 is exposed while forming the N-side pad electrode 22. That is, when the P-side and N-side electrodes are on the same face side, after forming the multi-layer structure on the substrate to the P-type contact layer, it is necessary to remove at least a region down to the N-side electrode from the P-side of the semiconductor multi-layer structure, so as to expose the N-type contact layer. For example, after forming the multi-layer structure of the P-type contact layer 19, a resist film is made by way of a coating and thereafter it is exposed so as to make a desired pattern on it. The portion other than the portions for P-side electrode (the first region) and for the protrusions 23 (the second region) are removed by way of etching, or the like, using the remaining resist layer as a mask. By doing this, the protrusions 23 can be formed at the time of forming the exposed portion of the N-type electrode and the number of production process steps can be reduced.

The protrusion 23 formed in this manner has the same multi-layer structure as the semiconductor multi-layer structure in the first region. However, although the active layer 17 included in the first region functions as a light emitting layer, the active layer 17 included in the protrusion in the second region does not function as a light emitting layer. This is because the first region is provided with the P-side electrode.

On the other hand, the P-side electrode is not formed in the second region. That is, the carrier (hole and electron) can be supplied to the active layer 17 in the first region by way of electricity, however, the active layer 17 of the protrusion 23 provided in the second region cannot be supplied with a carrier by way of electricity. Thus, the protrusion 23 of the present invention cannot emit light by itself. If the P-side electrode is formed on the protrusion 23 and an electric current is sent in the protrusion, an emission is generated from the active layer included in the protrusion, however, this is not desirable because of the excess driving voltage due to the narrowed current path. In addition, the area of the active layer is so small that it is hardly able to participate in the emission of light. It is preferable to form the protrusion by dividing the regions into a first region which is directly involved in emission and a second region where direct participation in emission does not occur.

As described above, the semiconductor light emitting element of the present example is designed to reduce the amount of light emitted laterally (in the direction of the side face of the LED) and to selectively emit light upwardly (in the direction of the observing surface). Accordingly, in the case where the semiconductor element is placed on an organic support member, the life of the support member can be extended. That is, by using the semiconductor light emitting element of the present example, deterioration of the support part caused by light emitted from the side face of the semiconductor light emitting element can be greatly reduced. Such an effect can be seen clearly in the case where the surface of the support body is formed close to the semiconductor light emitting element.

In addition, the protrusions 23 are not formed in the region between N-side pad electrode 22 and the diffusion electrode 20 in the semiconductor light emitting element of the present example. However, the protrusion 23 can be formed in this region. Since the light emission in the vicinity of the N-side pad electrode 22 is relatively strong, the above effect can be enhanced by forming the protrusion 23 between the N-side pad electrode 22 and the diffusion electrode 20.

As described above, a semiconductor light emitting element having a shape with a long side and a short side is mounted on the bottom of the recess of the package as described in the other examples. At this time, the semiconductor light emitting element is placed, so as to position the long side of the bottom of the recess and the long side of semiconductor light emitting element approximately parallel to each other. Also, the short side of bottom of the recess and the short side of the semiconductor light emitting element are positioned approximately parallel to each other. That is, the light emitting device comprises a semiconductor light emitting element in a shape having a long side and a short side, and a package having a recess with a shape that corresponds to the size and shape of the semiconductor light emitting element. Thus, if the package is thin and the shape of the bottom of the recess is made so as to have a long side and a short side, the entire bottom face of the recess can be secured for mounting the semiconductor light emitting element. Furthermore, the light extraction efficiency of the light emitting device can be enhanced. Moreover, in the case where the size of the semiconductor is such that it occupies the entire face in the bottom of the recess, the side face of the semiconductor light emitting element and the inner wall of the recess are closely placed and opposite to each other. However, emission from the end face of the semiconductor multi-layer structure can be directed toward the observing plane by the above recess formed in the semiconductor light emitting element. Thus, the light emitting element according to the present invention can greatly reduce the deterioration of the support member which contains an organic material caused by the light emitted from the side face of the semiconductor light emitting element.

Example 9

The semiconductor light emitting element of the present example is described in connection with FIG. 14. The semiconductor light emitting element of the present example has a similar structure to the semiconductor light emitting element described in Example 8, except for the configuration of the semiconductor laminated structure in the first region, the corresponding shape of the diffusion electrode 20, and the region where the protrusions 23 are formed.

That is, the semiconductor light emitting element of the present example includes a constricted portion in the first region which is between the N-side pad electrode 22 and P-side pad electrode 21 when viewed from the P-N electrodes positioning side. In addition, a plurality of protrusions 23 are formed in the constricted portion. Thus, effective light emission and light extraction toward the observing face side can be obtained.

Figure 14:
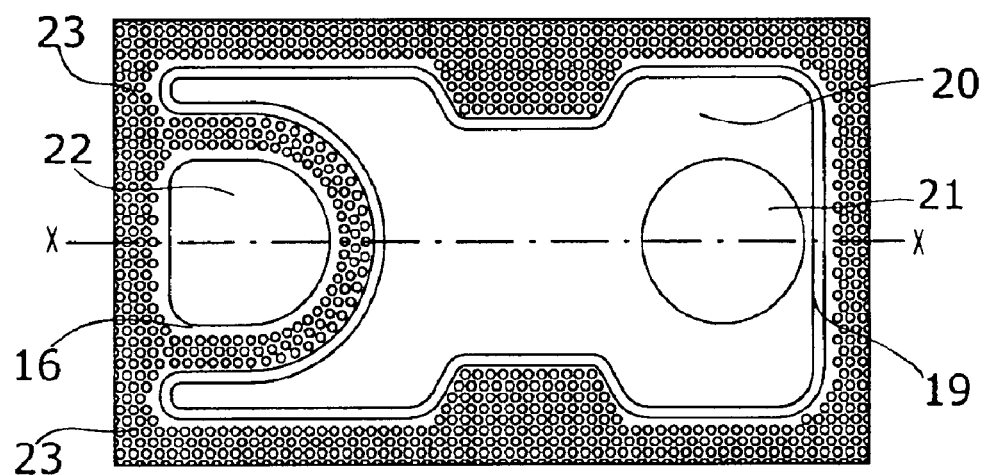
FIG. 14 is a schematic plan view of a semiconductor light emitting element according to another example of the present invention.

In detail, in the semiconductor light emitting element of the present example, the P-side pad electrode 21 and N-side pad electrode 22 are placed on the dotted line X—X in FIG. 14. When viewed from the electrode forming face side, the P-side diffusion electrode 20 has a long side disposed along the dotted line X—X, and correspondingly, the shape of the semiconductor light emitting element also has a long side disposed along the dotted line X—X. In addition, an electric current from the P-side pad electrode 21 to N-side pad electrode 22 flows mainly in the direction of the dotted line X—X, so as to take the shortest route. However, for the diffusion electrode 20 formed between the P-side pad electrode 21 and N-side pad electrode 22, the electric current supply is difficult for the regions which are farther from the following three regions: along dotted line X—X, the P-side pad electrode 21, and the N-side electrode 22. Therefore, emissions from these other regions are weaker than from these three regions. In view of these circumstances, in the semiconductor light emitting element of the present example, the constricted portion is provided in the first region located between the N-side pad electrode 22 and the P-side pad electrode 21. The semiconductor laminated structure in the region corresponding to the constricted portion has its emission ability removed, and a plurality of protrusions 23 are formed in the constricted portion so that desirable light extraction can be realized. The reason for intentionally removing the region of weak emission corresponding to the constricted portion, and forming the protrusions thereon allows strong emissions to be released directly to the outside of the side face. These strong emissions change their direction to the observing face side due to the protrusions, thereby improving light extraction and achieving directional control of the light.

Example 10

Figure 15:
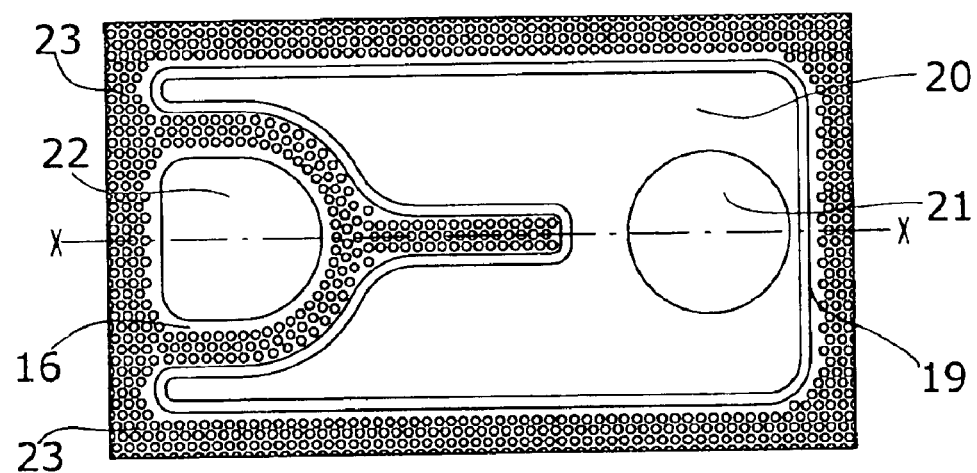
FIG. 15 is a schematic plan view of a semiconductor light emitting element according to yet another example of the present invention.
Figure 16A:
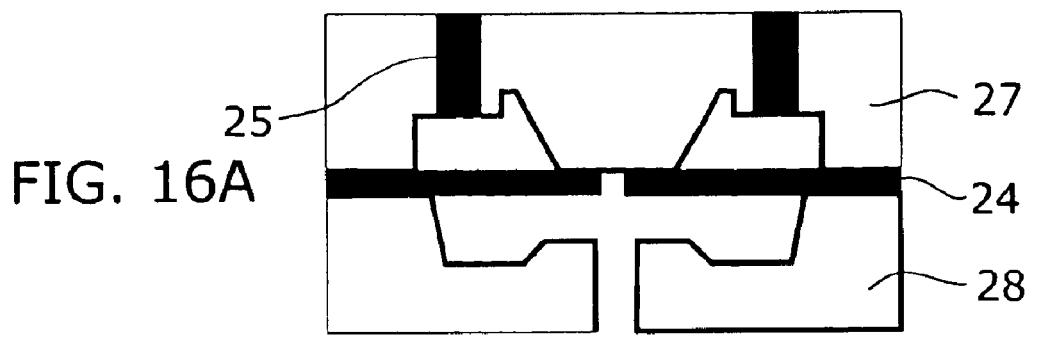
FIGS. 16A, 16B, 16C and 16D are schematic cross sectional views showing the process steps for making an embodiment of the present invention.
Figure 16B:
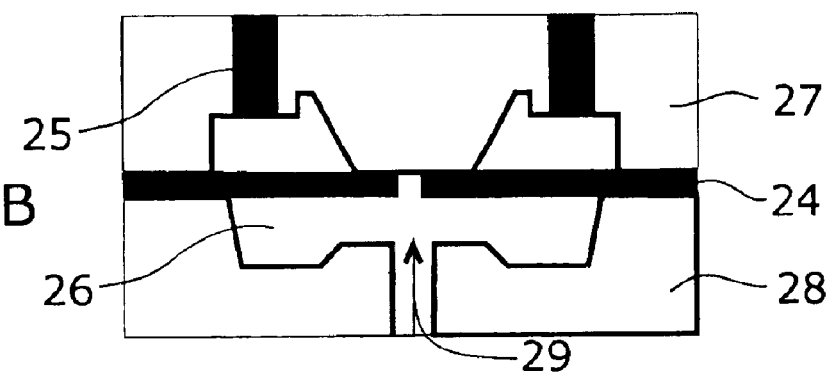
Figure 16C:
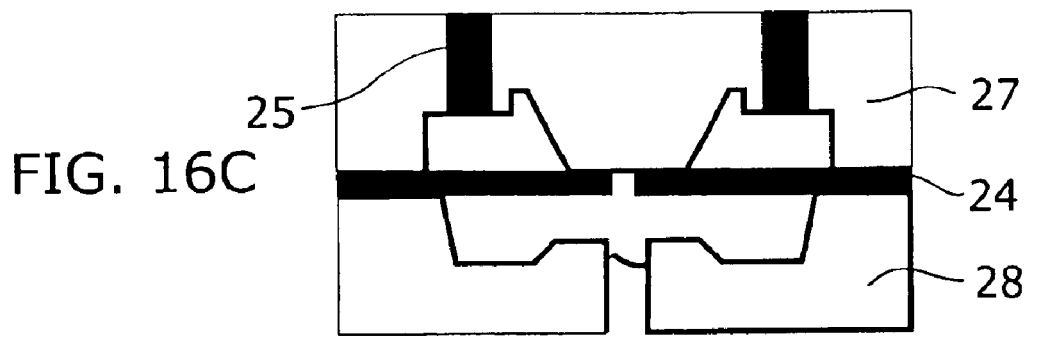
Figure 16D:
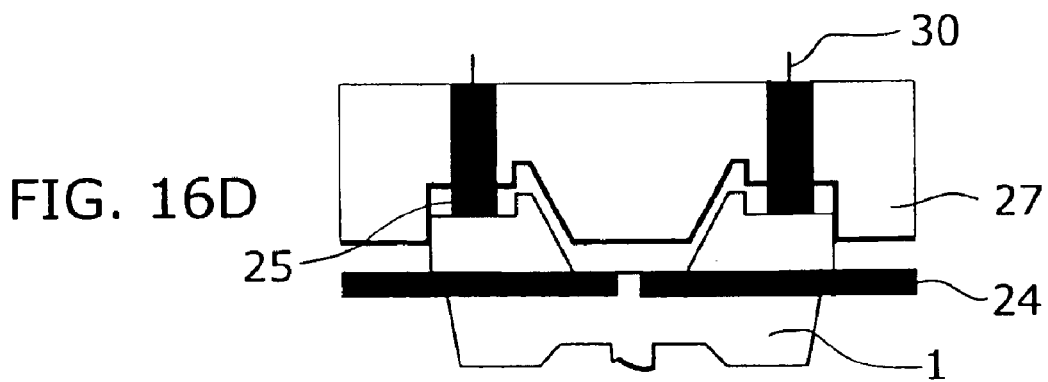

The semiconductor light emitting element of this example is described according to FIG. 15. The semiconductor light emitting element in the present example has a configuration as described in the above example, except for the shape of the semiconductor multi-layer structure in the first region, the shape of the corresponding diffusion electrode 20, and the region where the protrusions 23 are formed.

That is, the semiconductor light emitting element in the present example can improve light extraction and directional control of light by surrounding the second region where the protrusions 23 are formed with the first region. Moreover, preferably the second region has protrusions 23 which are surrounded with the first region so that at least a portion of it overlaps in the vicinity of the dotted line X—X. As described above, the electric current mainly flows along the dotted line X—X. However, by intentionally removing the portion in the vicinity of the dotted line X—X in the first region, and forming a plurality of protrusions 23 thereon, the light extraction efficiency and the directional control of light can be effectively improved.

The reason for this is believed to be that by intentionally removing a portion along the dotted line X—X, it becomes possible to spread the electric current to a wider area of the semiconductor multi-layer structure, and at the same time, a relatively strong light can be emitted from the end face of the semiconductor multi-layer structure. This includes the active layer which is removed in the region of the dotted line X—X and changes its direction to the observing surface via the plurality of protrusions 23 so the light extraction efficiency and the directional control of the light are improved.

In addition, according to the configuration of the semiconductor light emitting element in the present example, it is preferable to use a combination with the configuration described in Example 9. That is, by providing the constricted portion described in Example 9 with the semiconductor light emitting element of the present example, the above described effects can be further enhanced.

In addition, the semiconductor multi-layer structure of the semiconductor light emitting element in each of the above described examples is not limited. The material for the mixed crystal, its ratio, the number of layers in the multi-layer structure, and its sequence, or the like, can be various sorts of materials with different numbers for the ratio and the number of layers. In addition, these points can also be applied to a P-side electrode and an N-side electrode, so that the sequence of layers, the material, the thickness of the layers, or the like, can be set arbitrarily.

Example 11

The photo receptor or acceptance device according to the present embodiment is a light sensor photodevice that comprises a package formed in the same manner as in Example 1. The semiconductor element is used as the photodetector, and includes a lenticular translucent member which condenses external light entering the device toward the photodetector.

The mounting strength of the photo acceptance device of the present embodiment to a translucent member can be enhanced by forming a first main surface and a second main surface on a main surface of the package that is the light introducing portion.

As described in detail above, the light emitting device of the present invention provides a high precision mounting and good bonding strength with other members, by forming the first and the second main surfaces in the main surface of the package on the light emitting side.

By forming the light emitting device comprising the semiconductor light emitting element having a long side and a short side, and the package according to the present invention, the entire portion of the bottom face of the recess can be used for mounting the semiconductor light emitting element thereon, even when the light emitting device is made thinner. Furthermore, light extraction efficiency of the light emitting device can be improved.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

The texts of Japanese priority application no. 2002-259482 filed Sep. 5, 2002 and Japanese priority application no. 2003-133874 filed May 13, 2003 are hereby incorporated by reference.

What is claimed is:

1. A semiconductor device comprising:
a semiconductor element;
a support member having a recess including a sealing member therein for housing the semiconductor element, the support member including lead electrodes and a support part holding the lead electrodes so that a surface of each of the lead electrodes is exposed in a bottom of the recess; and
wherein the support member has a first surface disposed outside of the recess, a second surface disposed outside of and being offset from the first surface and a third surface disposed between the first surface and the second surface, the third surface having a portion including a notch.

2. A semiconductor device comprising:
a semiconductor element;
a support member having a recess for housing the semiconductor element, the support member including lead electrodes and a support part holding the lead electrodes so that a surface of each of the lead electrodes is exposed in a bottom of the recess;
wherein the support member has at least a first surface disposed outside of the recess having a sealing member therein and a second surface disposed outside of and offset from the first surface, the second surface having at least one of a protrusion and a further recess disposed thereon.

3. The semiconductor device according to claim 2, wherein the further recess is a depression and the protrusion forms an outer wall of the depression.

4. The semiconductor device according to claim 2, wherein a sub-mount substrate is disposed in the recess, and wherein the semiconductor element is disposed on the sub-mount substrate and a conductive paste material is disposed between a conductive pattern formed on the sub-mount and the lead electrodes.

5. The semiconductor device according to claim 2, wherein the sealing member has an emission surface having a substantially elliptical shape.

6. The semiconductor device according to claim 5, wherein the emission surface has a depression that is an approximately symmetrical parabola with respect to the light emitting element when viewed along the vertical axis extending from the top surface to the bottom of the recess.

7. The semiconductor device according to claim 2, wherein the sealing member further comprises at least one of:
a fluorescent material containing Al and at least one element selected from Y, Lu, Sc, La, Gd, Tb, Eu, Ga, In, and Sm; and activated with at least one element selected from the rare earth elements, and
a fluorescent material containing N, at least one element selected from Be, Mg, Ca, Sr, Ba, and Zn; and at least one element selected from C, Si, Ge, Sn, Ti, Zr, and Hf; and activated with at least one element selected from the rare earth elements.

8. The semiconductor according to claim 2, wherein the sealing member comprises a first layer including a diffusion agent and a second layer including another diffusion agent having a content different from that of the first layer.

9. The semiconductor device according to claim 8, wherein the surface of the semiconductor element is covered with the first layer.

10. The semiconductor device according to claim 2, wherein the sealing member has an emission surface having a shape that is an approximately symmetrical parabola with respect to the light-emitting element when viewed along the vertical axis extending from the top surface toward the bottom of the recess.

11. The semiconductor device set forth in claim 2, wherein the further recess is a cylindrical recess and the protrusion is a circular protrusion.

12. The semiconductor device set forth in claim 2, wherein said protrusion is a cylindrical protrusion.

13. The semiconductor device set forth in claim 2, wherein the further recess is a cylindrical recess.

14. The semiconductor device set forth in claim 2, wherein said protrusion is a protrusion extending between opposite surfaces of the support member.

15. The semiconductor device set forth in claim 2, further comprising at least one of:
a fluorescent material containing Al and at least one element selected from Y, Lu, Sc, La, Gd, Tb, Eu, Ga, In, and Sm; and activated with at least one element selected from the rare earth elements, and
a fluorescent material containing N, at least one element selected from Be, Mg, Ca, Sr, Ba, and Zn; and at least one element selected from C, Si, Ge, Sn, Ti, Zr, and Hf; and activated with at least one element selected from the rare earth elements.

16. The semiconductor device set forth in claim 2, wherein said semiconductor element further comprises at least one of:
a fluorescent material containing Al and at least one element selected from Y, Lu, Sc, La, Gd, Tb, Eu, Ga, In, and Sm; and activated with at least one element selected from the rare earth elements, and
a fluorescent material containing N, at least one element selected from Be, Mg, Ca, Sr, Ba, and Zn; and at least one element selected from C, Si, Ge, Sn, Ti, Zr, and Hf; and activated with at least one element selected from the rare earth elements.

17. A semiconductor device comprising:
a semiconductor element;
a support member having a recess for housing the semiconductor element, the support member including lead electrodes and a support part holding the lead electrodes so that a surface of each of the lead electrodes is exposed in a bottom of the recess;
wherein the support member has at least a first surface disposed adjacent to the recess and a second surface disposed adjacent to and offset from the first surface of the support member; and
wherein the semiconductor element comprises a semiconductor having a laminated structure with at least a N-type contact layer of a nitride semiconductor having an N-side electrode and a P-type contact layer of the nitride semiconductor having a P-side electrode, the N-type contact layer comprises a first region including a semiconductor laminated structure having a P-side electrode, and a second region including a plurality of protrusions, when viewed from an electrode forming face side; and wherein a top portion of the protrusions is closer to a level of the P-type contact layer than a level of an active layer as viewed along a cross sectional view of the semiconductor element.

18. The semiconductor device according to claim 17, wherein the second surface has a surface protrusion and a further recess disposed thereon, the further recess is a depression and the surface protrusion forms an outer wall of the depression.

19. An optical device comprising:
a semiconductor device including
a semiconductor element;
a support member having a recess for housing the semiconductor element, the support member including lead electrodes and a support part holding the lead electrodes so that a surface of each of the lead electrodes is exposed in a bottom of the recess, the support member further having at least a first surface disposed outside of the recess and a second surface disposed outside of and offset from the first surface; and
a sealing member disposed in the recess, said sealing member having an emission surface below said first surface; and
a translucent member for allowing light to exit from the semiconductor device, or for allowing light to be received by the semiconductor device, the translucent member having a light entrance portion and a light emitting portion; and
wherein the emission surface has a shape that is an approximately symmetrical parabola with respect to the light emitting element when viewed along the vertical axis extending from the emission surface toward the bottom of the recess.

20. The optical device set forth in claim 19, wherein the emission surface is so configured that a gap is formed between the emission surface and the light entrance portion.

21. An optical device comprising:
a semiconductor device including
a semiconductor element;
a support member having a recess for housing the semiconductor element, the support member including lead electrodes and a support part holding the lead electrodes so that a surface of each of the lead electrodes is exposed in a bottom of the recess, the support member further having at least a first surface disposed outside of the recess and a second surface disposed outside of and offset from the first surface, the second surface having at least one of a protrusion and a further recess disposed thereon; and
a sealing member disposed in the recess, said sealing member having an emission surface below the first surface; and
a translucent member for allowing light to exit from the semiconductor device, or for allowing light to be received by the semiconductor device, the translucent member having a light entrance portion and a light emitting portion.

22. The optical device according to claim 21, wherein the further recess is a depression and the protrusion forms an outer wall of the depression.

23. The optical device set forth in claim 21, wherein said emission surface has a shape that is an approximately symmetrical parabola with respect to the light emitting element when viewed along the vertical axis extending from the top surface to the bottom of the recess.

24. The optical device set forth in claim 21, wherein the emission surface is so configured that a gap is formed between the emission surface and the light entrance portion.

25. A semiconductor device comprising:
a semiconductor element;
a support member having a recess for housing the semiconductor element, the support member including lead electrodes and a support part holding the lead electrodes so that a surface of each of the lead electrodes is exposed in a bottom of the recess; and
wherein the support member has at least a first surface disposed outside of the recess having a sealing member therein, the first surface having at least one of a protrusion and a further recess disposed thereon.

26. A semiconductor device set forth in claim 25, wherein said first surface includes the protrusion disposed on an end.

27. A semiconductor device set forth in claim 25, wherein said first surface includes the further recess having a circular inner wall.

28. A semiconductor device set forth in claim 25, wherein said first surface includes the protrusion having a circular outer wall.

29. A semiconductor device set forth in claim 25, further comprising a second surface adjacent to the first surface and said second surface being angularly offset from the first surface.

30. A semiconductor device set forth in claim 25, wherein said first surface includes the further recess angularly extending between opposed surfaces of the semiconductor device.

31. The semiconductor device set forth in claim 25, wherein the further recess is a circular recess.

32. The semiconductor device set forth in claim 25, wherein the protrusion is a circular protrusion.

33. A semiconductor device comprising:
a semiconductor element;
a support member having a recess for housing the semiconductor element, the support member including lead electrodes and a support part holding the lead electrodes so that a surface of each of the lead electrodes is exposed in a bottom of the recess;
wherein the support member has at least a first surface disposed outside of the recess having a sealing member therein and a second surface extending outwardly from the first surface, and
wherein the second surface is angularly offset from the first surface less than 90 degrees.

* * * * *